United States Patent
Murakami et al.

(10) Patent No.: US 6,212,540 B1
(45) Date of Patent: Apr. 3, 2001

(54) FILTER CIRCUIT

(76) Inventors: Chikara Murakami; Ichiju Satoh, both of c/o Ebara Research Co., Ltd. 2-1 Honfujisawa 4-chome, Fujisawa-shi, Kanagawa 251-8502 (JP)

(*) Notice: Subject to any disclaimer, the term of this patent is extended or adjusted under 35 U.S.C. 154(b) by 0 days.

(21) Appl. No.: 09/117,528
(22) PCT Filed: Dec. 4, 1997
(86) PCT No.: PCT/JP97/04435
§ 371 Date: Aug. 3, 1998
§ 102(e) Date: Aug. 3, 1998
(87) PCT Pub. No.: WO98/25341
PCT Pub. Date: Jun. 11, 1998

(30) Foreign Application Priority Data

Dec. 4, 1996 (JP) .................................................. 8-339040
Dec. 4, 1996 (JP) .................................................. 8-339041

(51) Int. Cl.[7] .................................................. G06G 7/02
(52) U.S. Cl. .................................................. 708/819
(58) Field of Search ........................... 708/819–820, 708/811, 300, 400–401, 440

(56) References Cited

U.S. PATENT DOCUMENTS

| | | | |
|---|---|---|---|
| 4,017,726 | * 4/1977 | Skutecki et al. | 708/811 |
| 4,045,616 | * 8/1977 | Sloane et al. | 708/400 |
| 4,047,002 | * 9/1977 | Sloane et al. | 708/400 |

FOREIGN PATENT DOCUMENTS

| | | |
|---|---|---|
| 8-168300 | 6/1996 | (JP) . |
| 8-251987 | 9/1996 | (JP) . |

* cited by examiner

Primary Examiner—Tan V. Mai

(57) ABSTRACT

A filter circuit is provided for two-axis signals which has good filtering characteristics such as steep filter characteristics in a narrow bandwidth without transformation from a stationary coordinate system into a rotating coordinate system and vice versa. Input signals related to orthogonal two axes are represented by a complex variable ($U=U_x+jU_y$: $U_x$, $U_y$ are respective quantities of Laplace transformation), and a transfer function of a lowpass or highpass filter of real coefficients is represented by $F(s)$. A complex coefficient transfer function produced by replacing the Laplace operator "s" in the transfer function $F(s)$ with "$s-j\omega$" is represented by $F(s-j\omega)$. When the input complex variable U is passed through the complex coefficient transfer function $F(s-j\omega)$, an output signal related to orthogonal two axes is expressed by a complex variable ($V=V_x+jV_y$: $V_x$, $V_y$ are respective quantities of Laplace transformation), and a transfer representation equation is expressed by $U\,F(s-j\omega)=V$. Connections are made with a transfer element of real coefficients in order to equalize real and imaginary parts of the transfer representation equation after both sides of the transfer representation equation are multiplied by the denominator of $F(s-j\omega)$.

13 Claims, 28 Drawing Sheets

Complex representation of selective bandpass filter

Complex representation of selective bandpass filter a : corner angular frequency

FILTER CIRCUIT

TECHNICAL FIELD

The present invention relates to a filter circuit using complex coefficients. More particularly, a first aspect of the present invention relates to a filter circuit for orthogonal two-axis signals which is suitable for the control of an inverter device for outputting a sine-wave voltage having an arbitrary frequency or the control of a rotational motor. A second aspect of the present invention relates to a filter circuit for the communication/control for a single-input single-output system, which realize a bandpass/stop filter of high steepness at a frequency range, or shifting an arbitrary phase angle at a frequency range, while employing lowpass filter or high-pass filter circuits using real coefficients.

BACKGROUND ART

The background art of the first aspect of the present invention will first be described below.

An inverter device having a variable fundamental AC frequency generally produces an output signal of rectangular wave according to pulse width modulation (PWM). Since rectangular waves contain many harmonic components, they tend to give rise to noise. One proposal to solve such a problem has been a system for outputting a sine wave by rounding the corners of a rectangular wave to get rid of harmonic components. For outputting such a sine wave, it has been practiced to extract only harmonic components with a usual highpass filter using real coefficients and feed back the extracted harmonic components. However, because the highpass filter allows a low-frequency fundamental component to be fed back without being fully removed, and also because the difference between high and low frequencies is reduced as the frequency of the fundamental component rises, it is difficult to remove the low-frequency fundamental component, resulting in a reduction in inverter device performance.

Conventional systems using filters represented by transfer functions using real coefficients find it difficult to separate two close resonant frequencies of the same sign and also resonant frequencies of opposite signs (+, −) whose absolute values are equal or very close to each other. For example, there is an instance where there are two resonant modes of opposite signs whose absolute are very close to each other. In such an instance, one of the modes is to be left untouched because sufficient attenuation has been given thereto for some reasons, but the remaining mode needs to be selected if it is unstable. The above conventional filters fail to select the remaining mode only, but control both the modes simultaneously, with result that the mode to be left intact may be adversely affected.

One filter for eliminating the above drawback is known as a tracking filter. With such a tracking filter, a rotating coordinate system is assumed by rotating a stationary coordinate system at the angular velocity of its mode, and, as viewed from the rotating coordinate system, the angular velocity component is equivalent to a DC component because its frequency is zero. The DC component is separated by a highpass filter or a lowpass filter, and transformed back into the stationary coordinate system. Since this filter is required not to separate a certain AC component from a plurality of AC components, but to separate only a DC component transformed into the rotating coordinate system, it is quite easy to separate the DC component with a highpass filter or a lowpass filter.

In an apparatus for controlling the above inverter device, it has been proposed to regard a fundamental component as a DC component by way of coordinate transformation from the stationary coordinate system into the rotating coordinate system, remove the DC component with a highpass filter, and transform only harmonic components back into the stationary coordinate system so as to feed them back.

Specifically, FIG. 16 shows by way of example a control apparatus for an inverter device for outputting a sine wave. An AC electric power having a commercial voltage and frequency is supplied from a commercial three-phase AC power supply 11 to an inverter device 12, which outputs and supplies an AC electric power having an arbitrary voltage and frequency to a load 13 according to a command from a pulse width modulation circuit 15. A resonant circuit 14 removes high-frequency components from a pulse-width-modulated rectangular wave outputted from the inverter device 12, thus generating a voltage waveform close to a sine wave. The output voltage waveform supplied to the load 13 is converted by a three-phase-to-two-phase converter 17 into an orthogonal two-axis signal, which is then transformed from a stationary coordinate system into a rotating coordinate system by a coordinate transformation circuit 18. The coordinate transformation is effected by calculating a matrix C. Since the transformed signal has a DC fundamental component, the DC fundamental component is removed by a highpass filter 19, and the signal is multiplied by a gain K by a calculating circuit 20. The signal is then transformed back into the stationary coordinate system by a coordinate transformation circuit 21 which calculates a matrix $C^{-1}$. The transformed signal is converted into a three-phase signal by a two-phase-to-three-phase converter 22. The three-phase signal is subtracted from a signal from a fundamental signal generator 16 by an adder 23, and hence is fed back to the input of the inverter device.

It is well known to design and analyze speed control circuits for inverter devices associated with motors, synchronous machines, etc. by transforming signal components into orthogonal coordinates referred to as d-q coordinates or γ-δ coordinates. According to the present invention, as described later on, no consideration at all is given to filter circuits using complex coefficient transfer functions as two-input/two-output systems, and applications of complex gains.

In the above example of the apparatus for controlling inverter device, since the fundamental is AC, the rotational angle of the rotating coordinate system is not constant or stationary, and the rotating coordinate system keeps rotating. For coordinate transformation, therefore, as shown in FIG. 16, there is required a matrix calculating circuit, i.e., a resolver circuit, for generating at all times sine and cosine waves of the rotational angle of the rotating coordinate system as time functions, multiplying two input signals by the generated sine and cosine waves, separating and combining their vectors. Since inverse transformation into the original stationary coordinate system is needed, two such resolver circuits are necessary. If they are constructed as analog circuits, then many hardware components will be required, resulting in a complex circuit arrangement. If they are constructed as digital circuits, then the time required for necessary calculations will be long.

According to the above conventional process, it has been impossible to adjust the phase of an orthogonal two-axis signal to an arbitrary value irrespective of the frequency as with the gain. Furthermore, it has heretofore been impossible to change the phase sharply by ±180° during a certain angular frequency.

The background of the single-input single-output filter circuit for use in communication, control, etc. according to the second aspect of the present invention will be described below.

Filter circuits for use in various forms of communication, control, etc. have heretofore been designed and constructed on the basis of transfer functions using real coefficients. With conventional lowpass or highpass filters, no distinction is made between positive and negative values of the angular frequency $\Omega$ of signals. If the negative frequency range is covered, then the conventional lowpass or highpass filters have symmetrical gain characteristics with respect to the origin, i.e., the zero frequency. This means that the conventional lowpass or highpass filters have been used as a bandpass or bandstop filter whose central frequency is zero. Therefore, as shown in FIG. 19, as corner angular frequencies (a, b) are higher, the bandwidth is greater. It is difficult to obtain highly steep gain characteristics when the horizontal coordinates are represented on a linear scale, but not a logarithmic scale log $\Omega$, of the angular frequency.

This can easily be understood from the fact that while the gradient (dB/dec) of an approximating broken line of the gain characteristic of an ordinary Bode diagram remains the same in any frequency ranges, a change (increase) in the frequency, not logarithmic, represented by horizontal coordinates is much greater as the corner frequency is higher. For example, changes per 1 dec. in corner frequencies 10 and 1000 are 100−10=90 and 10000−1000=9000, respectively, and the former is 100 times steeper than the latter on the linear scale though they are of the same gradient in a Bode diagram.

A biquad filter is known as a filter using a conventional resonant circuit of real coefficients. The biquad filter comprises two integrating circuits connected into a feedback loop. While the biquad filter provides a bandpass filter having a relatively narrow bandwidth, it is problematic in that it is difficult to control the steepness of the filter if the resonant frequency $\omega$ is variable.

The control of a high-speed rotating body requires a filter circuit for passing or stopping a narrow bandwidth in the vicinity of the rotational speed of the rotating body. It has been the conventional practice to achieve the steep characteristic of such a narrow band filter by transforming coordinates from the stationary coordinate system into the rotating coordinate system and replacing the rotational speed with zero. Specifically, an input signal in the stationary coordinate system is multiplied by a sine or cosine function so as to be transformed into the rotating coordinate system. Then, a rotationally synchronized signal component is removed by a lowpass filter, leaving only a frequency component in a narrow band, which needs to be transformed back into the stationary coordinate system. Therefore, it has been necessary to prepare, in addition to the lowpass filter, two coordinate transformation circuits by generating sine and cosine functions corresponding to the rotational speed of the rotating body.

With the above conventional process, it is impossible to adjust a phase to an arbitrary value irrespective of the frequency as with the gain.

For the control of a rotating body, since it is controlled from radial orthogonal two axes, it is often customary to use real numbers for signals related to the x-axis and complex variables with imaginary numbers multiplied by j for signals related to the y-axis. Transfer functions including complex numbers are highly effective analytical means for such an application. For such transfer functions including complex numbers, a distinction should be made between positive and negative values of the frequency, and characteristic roots of a system do not necessarily become conjugate roots.

For example, a first-order lowpass filter k/(a+s) has a corner angular frequency "a" and a central angular frequency which is zero. Therefore, in a complex system, if the central angular frequency is not limited to zero, but is $\omega$, for example, then k/{a+(s−j$\omega$)} changes to a complex coefficient transfer function. At the same time, "a" represents the distance from $\omega$, not from zero, or half the passband. Inasmuch as $\omega$, even though it is of a high value, is returned to the origin, if $\omega$ is selected to be 1000 and "a" is selected to be 10, the gradient of the broken line is about 100 times steeper than the case of $\omega$=0 on the logarithmic scale, and ($\omega$−a) on the opposite side of $\omega$ is also represented by a broken line, resulting in a narrow steep bandpass characteristic.

However, since the filter circuits using complex coefficients for two-input/two-output systems handle variables on spatially orthogonal x- and y-axes as complex numbers, they cannot be used directly for communication/control for single-input single-output systems.

DISCLOSURE OF INVENTION

It is an object of the first aspect of the present invention to provide a filter circuit for two-axis signals which has good filtering characteristics such as steep filter characteristics in a narrow bandwidth without transformation from a stationary coordinate system into a rotating coordinate system and vice versa.

Stated otherwise, it is an object of the present invention is to provide a filter circuit capable of easily separating two modes in which frequencies in an apparatus for example for controlling inverter device are very close to each other, or two modes in which their absolute values are equal or very close to each other. Furthermore, it is also an object of the present invention to provide a filter circuit for orthogonal two-axis signals which is capable of giving an arbitrary gain and phase to a particular frequency range and of changing the phase sharply by ±180° during a certain frequency range.

The present invention is a filter circuit for orthogonal two-axis signals wherein input signals related to orthogonal two axes (whose quantities of Laplace transformation are represented by Ux, Uy, respectively) are expressed by a complex variable U=Ux+jUy, a transfer function of a lowpass or highpass filter of real coefficients is represented by F(s), a central angular frequency to be passed or stopped is represented by $\omega$, a complex coefficient transfer function produced by replacing the Laplace operator "s" in the transfer function F(s) with "s−j$\omega$" is represented by F(s−j$\omega$) ≡F(s−j$\omega$), and when the complex variable F is passed through the complex coefficient transfer function F(s−j$\omega$), output signals related to the orthogonal two axes (whose quantities of Laplace transformation are represented by Vx, Vy, respectively) are expressed by a complex variable (V=Vx+jVy), and a transfer expression is represented by:

$$U \cdot F(s-j\omega) = V$$

characterized in that connections are made with a transfer element of real coefficients in order to equalize real and imaginary parts of the transfer expression after both sides of the transfer expression are multiplied by the denominator of F(s−j$\omega$), and $\omega$ is to multiply as an input signal from a separate path when it is a time function.

Two positive or negative central angular frequencies to be passed or stopped are represented by constants or time functions $\omega_1$, $\omega_2$, respectively, with $\omega_1 \neq \omega_2$, and in order to pass a component including a bandwidth (2$a$) across $\omega_1$ at its center and stop a component including a bandwidth (2$b$) across $\omega_2$ at its center, and/or change a phase across frequency range from $\omega_1$ to $\omega_2$, said complex coefficient transfer function is represented by $k(s+b-j\omega_2)/(s+a-j\omega_1)$ or $k(s+b-j\omega_2)/\{(s-j\omega_1)^2+2za(s-j\omega_1)+a^2\}$ where k is an arbitrary gain or coefficient and z is an arbitrary dimensionless number.

The numerator and/or denominator of the transfer function F(s) includes a second-order system represented by $k(s^2+2zas+a^2)$ where k is an arbitrary real gain or coefficient and 2a represents a bandwidth with the central angular frequency ω to be passed or stopped, and regions near corners at opposite ends or break frequencies of the bandwidth of gain characteristics of frequency characteristics of the filter are brought closely to an ideal filter by replacing s with (s−jω) and selecting the dimensionless number arbitrarily.

A filter circuit for orthogonal two-axis signals, comprises a plurality of filter circuits for orthogonal two-axis signals, for passing or stopping a particular band in an entire frequency range or changing a phase across the central angular frequency as a boundary.

The complex coefficient transfer function of the filter circuit is multiplied by a complex gain (A+jB) where A, B are real constants, and a circuit is constructed according to claim 1, for imparting an arbitrary gain and phase to a particular frequency range.

A control apparatus for an inverter device outputs a sine wave voltage having an arbitrary frequency, wherein if the inverter device produces a polyphase output signal, two-phase output signals from orthogonal two axes are generated by coordinate transformation and supplied to the filter circuit to pass or stop a particular band in an all frequency range, or output signals with a phase changed across the central angular frequency as a boundary are generated by coordinate transformation if the output signals are polyphase output signals, and fed back to the inverter device.

It is an object of the second aspect of the present invention to provide a filter circuit applicable to general-purpose communications and control applications of a single-input single-output system, using excellent characteristics of a complex coefficient filter circuit of a two-input two-output system.

In a filter circuit for communications/control, an input signal (whose quantity of Laplace transformation is represented by Ux) of a filter circuit of a two-input/two-output system is branched into two signals, one of the two signals is supplied to an input of the filter circuit, Ux is passed through a circuit (j circuit) which generates a signal that is 90 degrees out of phase with Ux, and supplied as an imaginary input signal (Uy) to another input of the filter circuit, the filter circuit outputs two output signals Vx, Vy in response to the input signals Ux, Uy supplied thereto, the two input signals and the two output signals are handled as respective complex variables (U=Ux+jUy, V=Vx+jVy) using an imaginary unit j, a transfer function of a lowpass or highpass filter of real coefficients is represented by F(s), a central angular frequency to be passed or stopped is represented by ω, a complex coefficient transfer function produced by replacing the Laplace operator "s" in the transfer function F(s) with "s−jω" is represented by F(s−jω)=F(s−jω), and when the input signal U is passed through the complex coefficient transfer function F(s−jω), an output signal is expressed by V, a transfer expression is represented by:

$$U \cdot F(s-j\omega)=V$$

characterized in that both sides of the transfer expression are multiplied by the denominator of F(s−jω), and connections are made with a transfer element of real coefficients in order to equalize real and imaginary parts of the transfer expression.

Two central angular frequencies to be passed or stopped are represented by $\omega_1$, $\omega_2$, respectively, with $\omega_1 \ne \omega_2$, and in order to pass a component including a bandwidth (2a) across $\omega_1$ at its center and stop a component including a bandwidth (2b) across $\omega_2$ at its center, said complex coefficient transfer function is represented by:

$$k(s+b-j\omega_2)/(s+a-j\omega_1)$$

or $$k(s+b-j\omega_2)/\{(s-j\omega_1)^2+2za(s-j\omega_1)+a^2\}$$

where k is an arbitrary gain or coefficient and z is an arbitrary dimensionless number.

In a filter circuit, the numerator and/or denominator of the transfer function F(s) includes a second-order system represented by:

$$k(s^2+2zas+a^2)$$

where k is an arbitrary real gain or coefficient and 2a represents a bandwidth with the central angular frequency to be passed or stopped, and regions near corners at opposite ends or break frequencies of the bandwidth of gain characteristics of frequency characteristics of the filter are brought closely to an ideal filter by replacing s with (s−jω) and selecting the dimensionless number arbitrarily.

A filter circuit for communications/control, comprises a plurality of filter circuits for communications/control, for passing or stopping a particular band in an entire frequency range or changing a phase across the central angular frequency as a boundary.

A tracking filter circuit is provided, where ω, $\omega_1$, $\omega_2$ are not constants, but variables, and instantaneous values thereof are supplied.

A filter circuit for communications/control, has a filter portion for extracting a necessary angular frequency component or a band component from an input signal with a complex coefficient transfer function of a two-input/two-output system, and a complex gain portion for imparting a necessary phase angle to the extracted component, and output signals having passed through the filter portion and the complex portion being used to estimate a state quantity required for control or stabilize a mode of the extracted component. The complex gain portion comprises a complex gain circuit represented by A+jB=Fc where A, B are real constants, and said complex gain portion is connected such that input signals (Ux, Uy) supplied to and output signals (Vx, Vy) from x- and y-axes of Fc are related as follows:

$$Vx=AUx-BUy$$

$$Vy=BUx+AUy$$

not only an arbitrary gain but also a phase angle can be imparted to the extracted component by selecting A, B arbitrarily, and an arbitrary necessary phase angle is imparted to only a frequency range required to estimate a signal related to communications or control.

The j circuit comprises an integrator in which, if there is a single passband or stopband, the numerator of an integrator 1/s is multiplied by a value, as a gain, which is a central angular frequency of the passband or stopband or in a range from 1/10 to 10 times thereof, or if there are plurality of passbands or stopbands, the numerator of an integrator 1/s is multiplied by a value, as a gain, which is an average of central angular frequencies of the passbands or stopbands or in a range from 1/10 to 10 times thereof, or an incomplete integrator in which a constant which is about 1/10 of said gain or less is added the denominator s of the integrator.

BRIEF DESCRIPTION OF DRAWINGS

FIGS. 1 through 18 are views relative to the present invention according to a first aspect.

FIG. 1 is a block diagram showing a first embodiment of the present invention;

FIG. 2 is a set of graphs representing characteristics of a circuit according to the embodiment shown in FIG. 1;

FIG. 3 is a block diagram showing a second embodiment of the present invention;

FIG. 4 is a set of graphs representing characteristics of a circuit according to the embodiment shown in FIG. 3;

FIG. 5 is a block diagram showing a third embodiment of the present invention;

FIG. 6 is a set of graphs representing characteristics of a circuit according to the embodiment shown in FIG. 5;

FIG. 7 is a set of graphs representing characteristics of another embodiment in which constants in the circuit according to the embodiment shown in FIG. 5 are varied;

FIG. 8 is a block diagram showing a fourth embodiment of the present invention;

FIG. 9 is a set of graphs representing characteristics of a circuit according to the embodiment shown in FIG. 8;

FIG. 10 is a block diagram of a control apparatus according to an embodiment of the present invention;

FIG. 11 is a block diagram of a complex gain circuit according to another embodiment of the present invention;

FIG. 13 is a block diagram of a control apparatus which employs a control circuit for a rotating body according to another embodiment of the present invention;

FIG. 14 is block diagram of transfer functions of the control circuit shown in FIG. 13;

FIG. 15 is a block diagram of a control apparatus which employs a control circuit for a rotating body according to another embodiment of the present invention;

FIG. 16 is a block diagram of a conventional control apparatus for an inverter device;

FIG. 17 is a diagram showing a conventional filter circuit; and

FIG. 18 is a graph showing a characteristic of a conventional second-order filter circuit.

FIGS. 19 through 24 are views relative to the present invention according to a second aspect.

FIG. 19 is a set of graphs showing characteristics of a lowpass or highpass filter;

FIG. 20 is a block diagram showing a basic arrangement of a filter circuit of a single-input single-output system;

FIG. 21 is a block diagram showing a first embodiment of the present invention;

FIG. 22 is a set of graphs showing characteristics of a circuit according to the embodiment shown in FIG. 21;

FIG. 24 is a set of graphs showing characteristics of a circuit according to the embodiment shown in FIG. 23;

BEST MODE FOR CARRYING OUT THE INVENTION

[The Present Invention According to a First Aspect]

Figure 1:
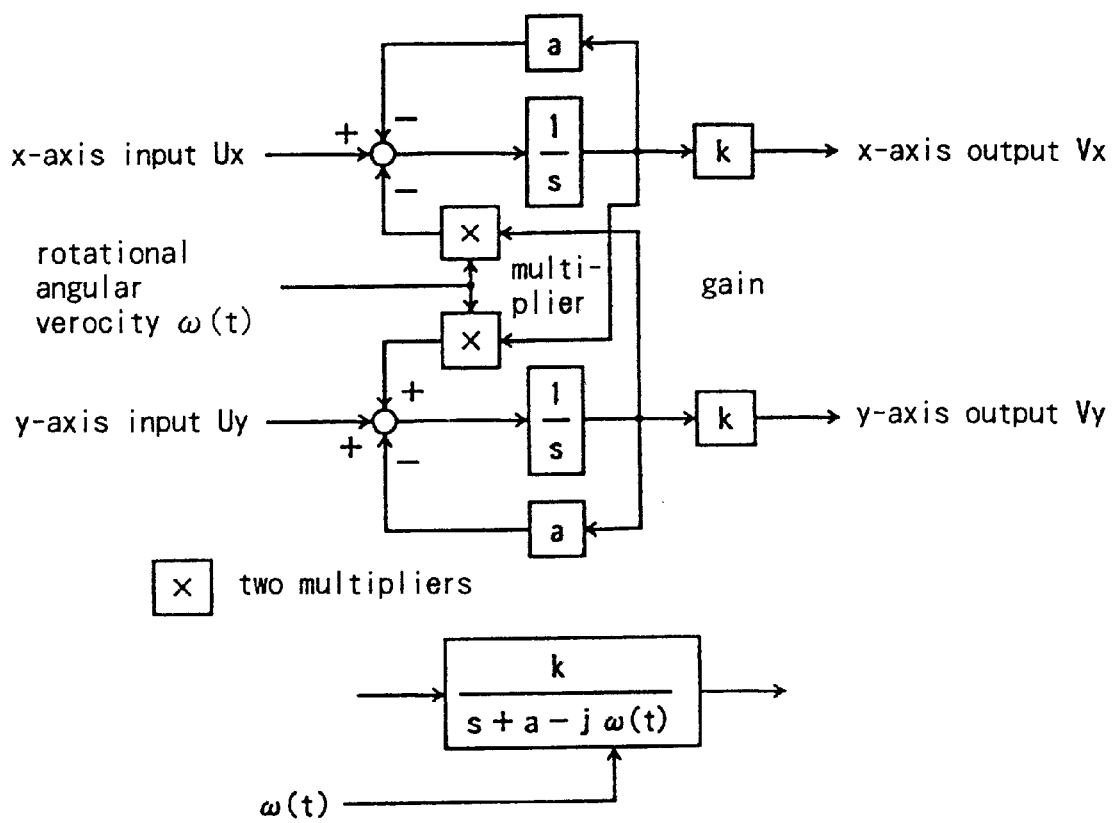

FIG. 1 is a block diagram showing a filter circuit according to a first embodiment of the present invention.

Figure 16:
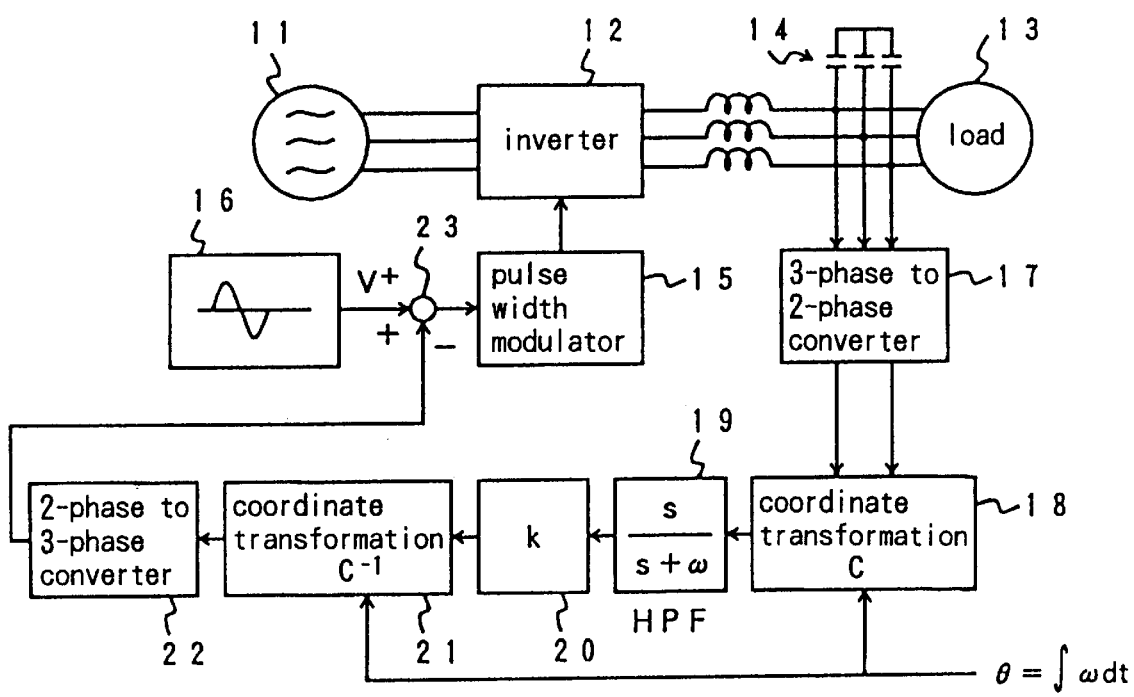

This filter circuit has a circuit arrangement for extracting only a fundamental component which varies with time (t) with a lowpass filter that is opposite to the highpass filter in the inverter device control circuit shown in FIG. 16. Specifically, the filter circuit comprises a tracking filter for being supplied with an orthogonal two-axis voltage signal converted from a three-phase signal into a two-phase signal, and outputting a signal comprising a component of a fundamental angular frequency ω which varies with time, extracted from the supplied signal, while removing other angular frequency components sharply, so as to be supplied to the three-phase-to-two-phase converter shown in the right-hand end of FIG. 16. While θ is inputted along another path in FIG. 16, an angular velocity ω that represents a rate of change of θ is inputted along another path in FIG. 1. They are related to each other according to θ=∫ωdt.

The two output signals from the converter 17 shown in FIG. 16 are supplied as input signals U=(Ux, Uy) along orthogonal two x- and y-axes, and the two-axis output signals of the present filter which are supplied to the converter 22 are represented by V=(Vx, Vy). A filter of real coefficients which is used in this filter is generated on the basis of a transfer function $F_1(s)$ of a first-order lowpass filter as follows:

$$F_1(s)=k/(s+a) \quad (1)$$

If the Laplace operator "s" in the transfer function $F_1(s)$ is replaced with (s−jω), producing a complex coefficient transfer function F(s−jω), then $$F_1(s-j\omega)=k/(s+a-j\omega) \quad (2)$$

Quantities of Laplace transformation of input signals related to the x- and y-axes are represented by Ux, Uy, respectively, and are expressed by a complex variable U=Ux+jUy, and output signals related to the x- and y-axes (whose quantities of Laplace transformation are represented by Vx, Vy, respectively) produced when the complex variable U has passed through the complex coefficient transfer function $F_1(s-j\omega)$ are expressed by a complex variable $V=Vx+jVy$. A transfer expression is represented by:

$$U \cdot F_1(s-j\omega)=V \qquad (3)$$

and is represented by:

$$k(Ux+jUy)/(s+a-j\omega)=Vx+jVy \qquad (4)$$

Both sides of the above equation are multiplied by the denominator $(s+a-j\omega)$ and expanded, and arranged into real and imaginary parts as follows:

$$kUx-aVx-\omega Vy=sVx \qquad (5)$$

$$kUy-aVy+\omega Vx=sVy \qquad (6)$$

When these equations are materialized, the filter circuit shown in FIG. 1 is realized. Specifically, the filter circuit comprises first-order low-pass filters including integrators $1/s$ disposed in respective signal paths of the x- and y-axes and each having a negative feedback loop whose gain is "a" that is ½ of the passband width. Output signals from the respective integrators are multiplied by an angular velocity signal $\omega$, which is not a constant, from another path, and fed back across each other between the x- and y-axes. The feedback loop from the x-axis to the y-axis is a positive feedback loop, whereas the feedback loop from the y-axis to the x-axis is a negative feedback loop. These feedback loops serve to selectively pass the angular frequency component.

Figure 2:
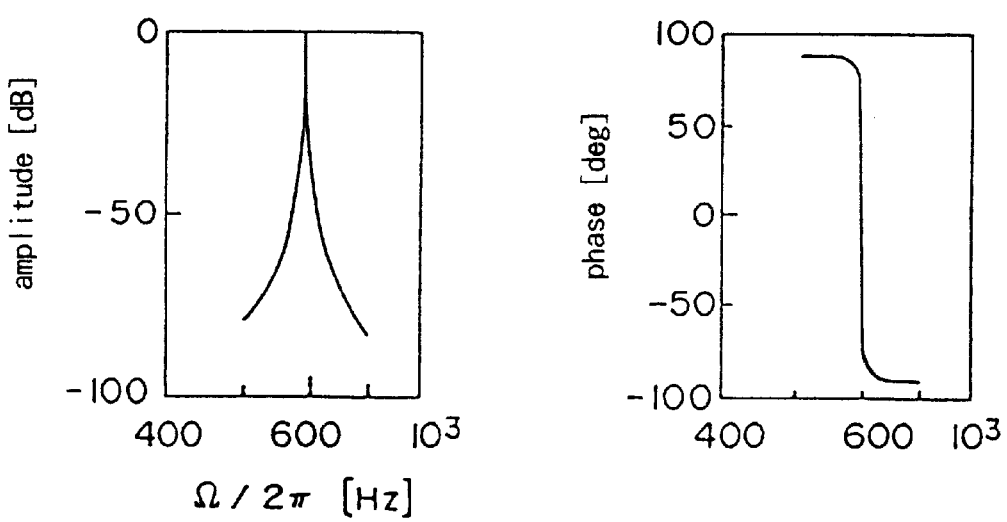

A Bode diagram where $\omega=3750$ [rad/s] and $a=k=7.5$ [rad/s] in this embodiment is shown in FIG. 2. The Bode diagram shows an advantage in that a band including a central frequency $\omega$ is passed with a characteristic of sharp selectivity.

Figure 17:
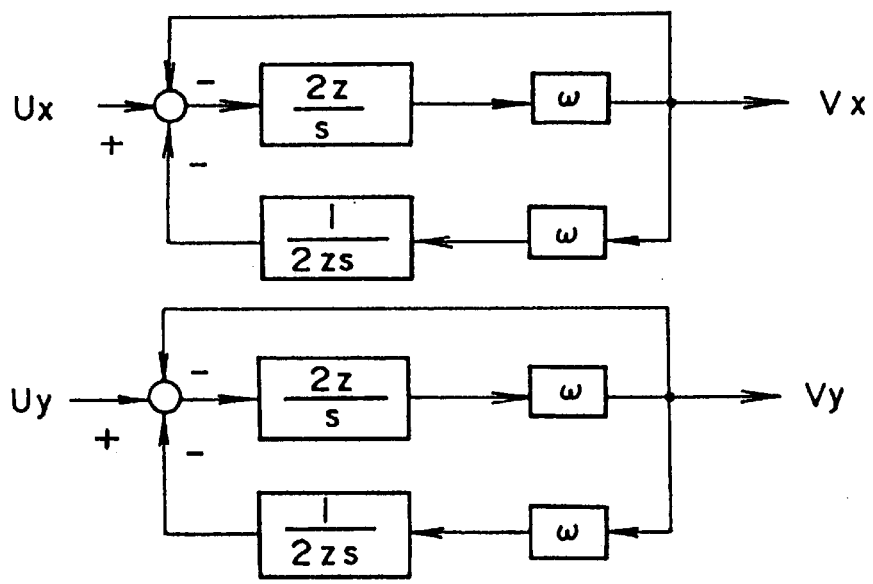

A conventional biquad filter corresponding to the filter circuit shown in FIG. 1 is given by:

$$V=\{2z\omega s/(s^2+2z\omega s+\omega^2)\}U \qquad (7)$$

where U and V are single-input and single-output, respectively, and z is a dimensionless number imparting the steepness of a filter, which corresponds to the reciprocal of a damping ratio or selectivity. The equation (7) is a real system, and should be provided individually for each of the two x- and y-axes. A specific block diagram of the biquad filter is shown in FIG. 17. This filter requires two integrators for each of the axes, and hence a total of four integrators. With "z" being fixed, the gradient of damping is constant in the Bode diagram. If the horizontal axis is on a linear scale, then the steepness falls in a high-frequency range, equivalently increasing the bandwidth. For eliminating these shortcomings with the conventional arrangement, it is necessary to express "z" as a function of $\omega$, supply "z" and $\omega$ along separate paths, and provide a number of multipliers. Therefore, the cost of the filter is increased, and the calculation time is also increased if the filter is implemented by a digital circuit.

The complex filter shown in FIG. 1, however, has a bandwidth "a" which remains unchanged, is simple and clear, comprises a hardware arrangement which is about half the conventional hardware arrangement, and requires a shorter calculation time for digital control. If $\omega$ is constant, then no multipliers are required. In the conventional arrangement shown in FIG. 16, since $\theta$ varies from time to time even if $\omega$ is constant, matrix calculations using sine and cosine wave function generators and multipliers are indispensable.

Figure 3:
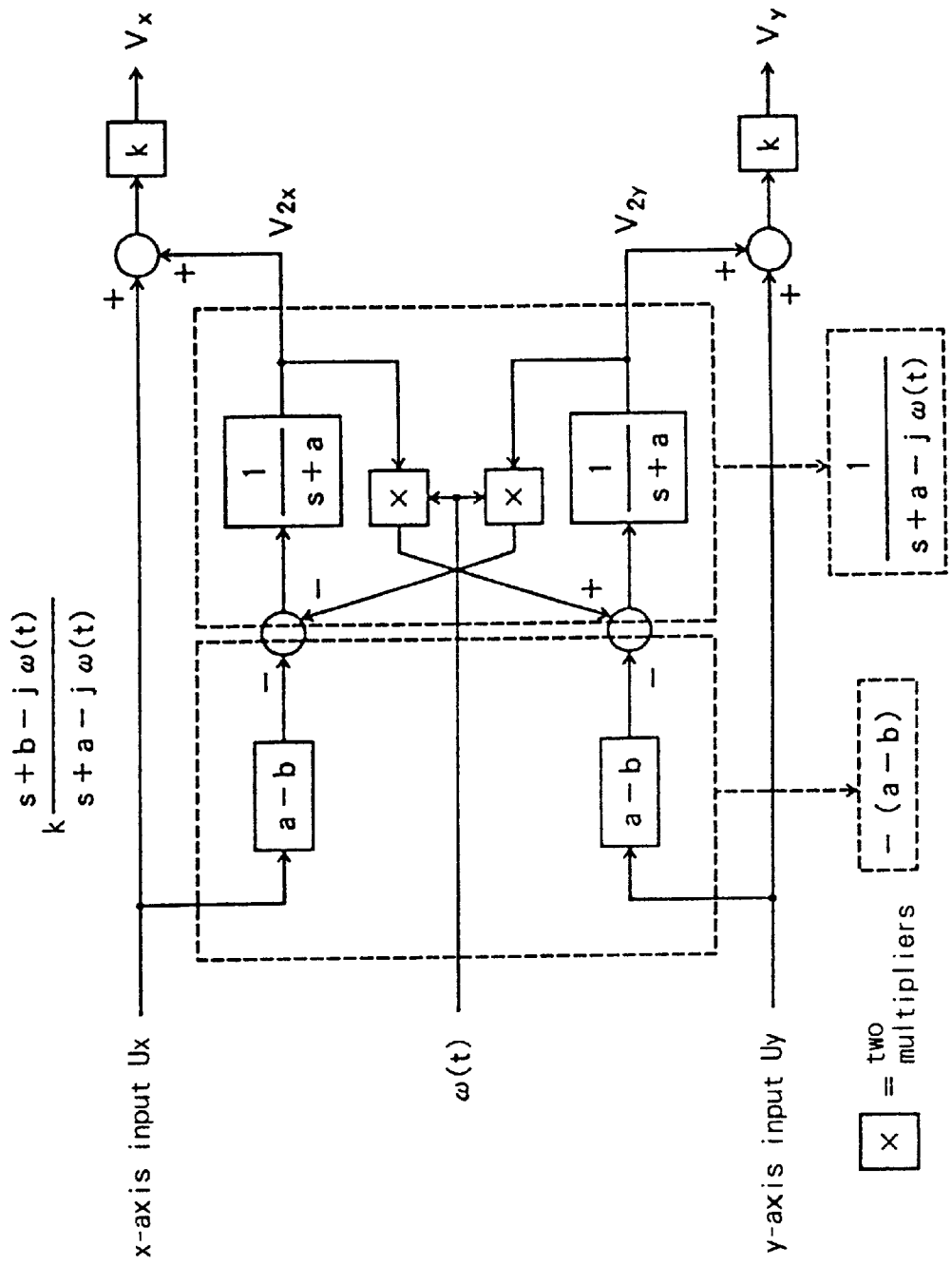

FIG. 3 shows a second embodiment of the present invention, which comprises a so-called notch filter for stopping only a signal having a certain angular frequency $\omega$.

A real coefficient transfer function as a base for the notch filter is given by:

$$F_2(s)=k(s+b)/(s+a),\ a,\ b>0 \qquad (8)$$

A complex coefficient transfer function is represented by $F_2(s-j\omega)$ that is given by replacing "s" with "s-j$\omega$" in the denominator and numerator of the above equation. Specific connections of the filter will be omitted here because they are a special case where $\omega_1=\omega_2=\omega$ in $F_3$ described later on. In the equation, "b" may be zero.

When the above equation is materialized, the filter circuit shown in FIG. 3 is realized.

Specifically, the signal paths of the respective axes include directly connected signal paths each having a gain "k", and first-order lag elements $1/(s+a)$ are branched from and parallel to the directly connected signal paths. Paths for multiplying input signals by a gain (a–b), which is produced by subtracting "b" that is ½ of the stop bandwidth from a corner angular frequency "a" of the first-order lag elements, and returning the products to the directly connected signal paths, are connected to the inputs and outputs of the first-order lag elements respectively. Crossing paths for feeding output signals of the first-order lag elements back to the first-order lag elements are connected across each other to the inputs of the first-order lag elements. To the crossing paths, there are applied an angular frequency $\omega$, to be stopped, as a variable from a separate path, for multiplying the feedback signals outputted from the first-order lag elements. The crossing path from the x-axis to the y-axis is connected in an additive fashion to the input of the first-order lag element, and the crossing path from the y-axis to the x-axis is connected in a subtractive fashion to the input of the first-order lag element. As a result, the angular frequency component signal is canceled and thence prevented from passing. The filter circuit is capable of compensating to ensure stable operation by stopping the passage of only one of positive and negative values of the angular frequency, and imparting a suitable phase to the remaining signal. If $\omega$ is constant and not variable, then the multipliers are not required, and replaced with blocks having a gain or coefficient $\omega$.

Figure 4:
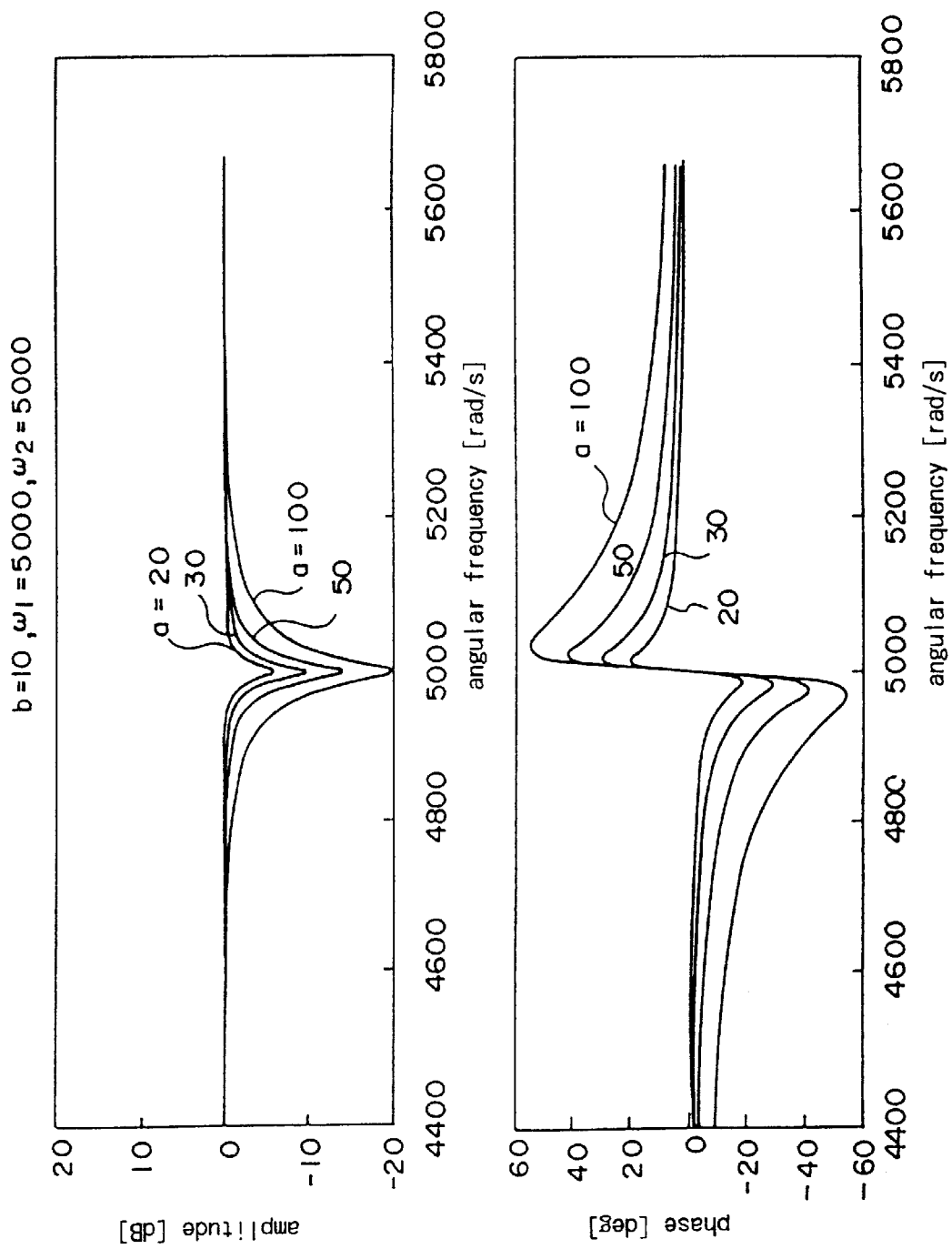

If $b>a>0$, then the filter serves as a bandpass filter, and if $k=a/b$, then the bottom of the skirt of the passing characteristics is 0 [dB]. Since only the phase changes, but the gain does not essentially change, in the vicinity of the outside of the stopband or passband (see FIG. 4), this feature can be used for control.

Figure 5:
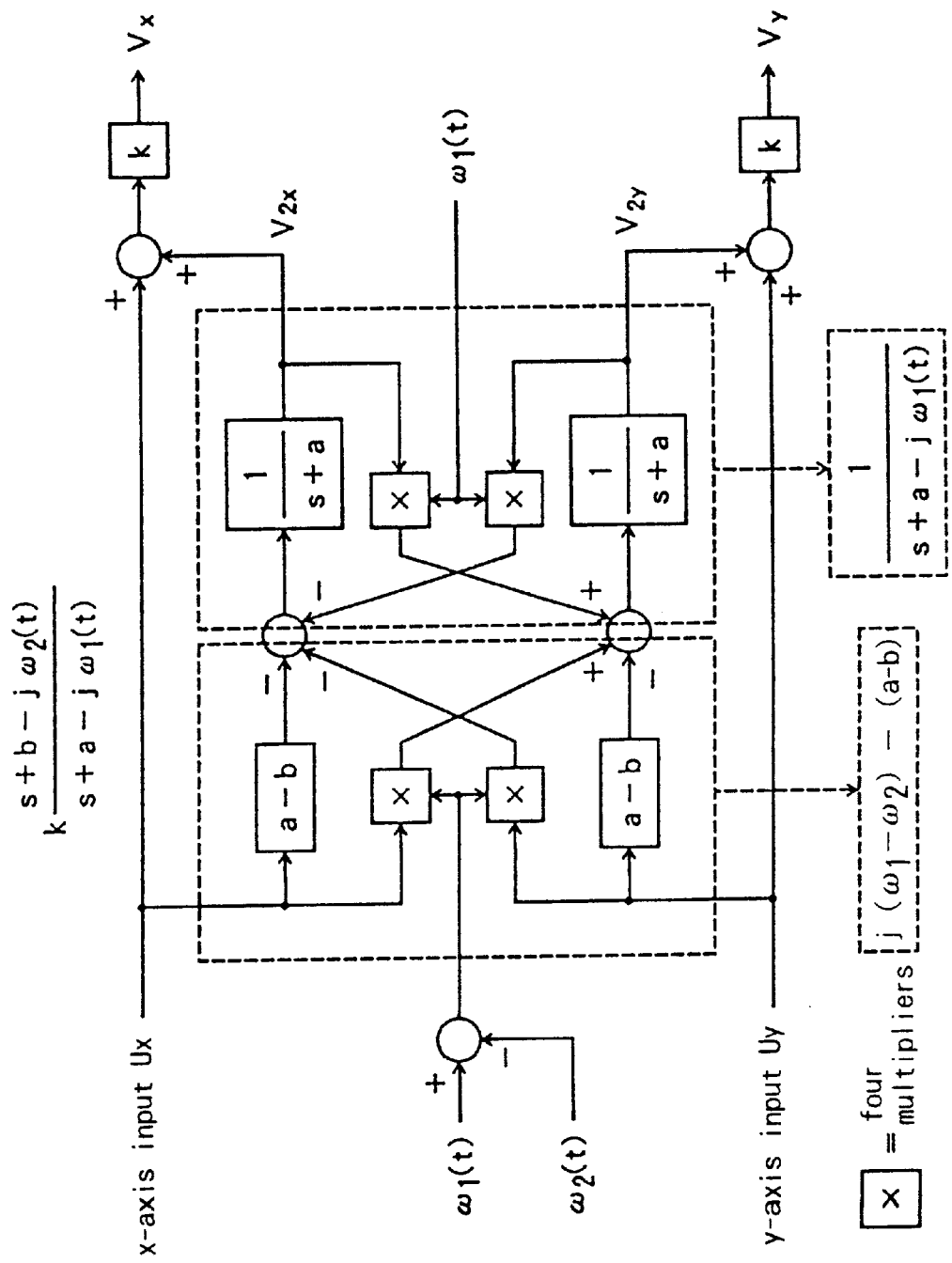

FIG. 5 shows a third embodiment of the present invention, which comprises a bilinear tracking filter circuit. The bilinear tracking filter circuit is a combination of the first and second embodiments, and functionally equivalent of the two filter circuits connected in series to each other. Specifically, the bilinear tracking filter circuit passes a positive or negative angular frequency component $\omega_1$ required for a signal to control the two x- and y-axes and stops another positive or negative angular frequency component $\omega_2$.

A transfer function where both the denominator and the numerator are of the first order (bilinear) is expressed as:

$$F_3=k(s+b)/(s+a) \qquad (9)$$

"s" in the denominator and the numerator of the above equation is replaced with $(s-j\omega_1)$, $(s-j\omega_2)$, respectively, producing a complex coefficient transfer function represented by:

$$F_3=k(s+b-j\omega_2)/(s+a-j\omega_1) \qquad (10)$$

The filter circuit according to the third embodiment is expressed by this equation. By reducing the order of the numerator, the equation (10) becomes:

$$F_3=k\{s+a-j\omega_1-(a-b)+j(\omega_1-\omega_2)\}/(s+a-j\omega_1)=k+k\{j(\omega_1-\omega_2)-(a-b)\}/(s+a-j\omega_1) \quad (11)$$

Therefore, the filter can be divided into a component which multiplies an input signal by "k" and passes the product therethrough, and a first-order lag element or lowpass filter including a complex constant of the second term. A process of constructing the second term only will be described below.

If $[\{b-a+j(\omega_1-\omega_2)\}/(s+a-j\omega_1)]$, which is obtained by removing "k" from the second term of the equation (11), is multiplied by an input signal U=(Ux+jUy), and the product is an output signal $V_2=V_2x+jV_2y$, then since the real and complex parts of a complex equation obtained after both sides are multiplied by the denominator are equal to each other, the following equations are satisfied:

$$Ux(b-a)-Uy(\omega_1-\omega_2)=V_2x(s+a)+V_2y\omega_1 \quad (12)$$

$$Ux(\omega_1-\omega_2)+Uy(b-a)=V_2y(s+a)-V_2x\omega_1 \quad (13)$$

From the equation (12), the following equation is obtained:

$$V_2x=[Ux(b-a)-Uy(\omega_1-\omega_2)-V_2y\omega_1]/(s+a) \quad (14)$$

Similarly, from the equation (13), the following equation is obtained:

$$V_2y=[Ux(\omega_1-\omega_2)+Uy(b-a)+V_2x\omega_1]/(s+a) \quad (15)$$

Multiplying the conjugate of the denominator of the equation (10) to convert the denominator into a real number would not be preferable because constituent elements would be increased, the order of the system would be increased, and the calculation time would be increased for digital control.

Connections according to the equations (14), (15) are indicated in portions enclosed by dotted lines, other than the circuit portions for passing signals therethrough. Specifically, signal paths of the x- and y-axes include directly connected signal paths each having a gain of 1 and two parallel circuits branched respectively from the directly connected signal paths. A gain of (b–a) which is produced by subtracting a corner angular frequency "a" of lowpass filters LPF connected thereto from ½ of the stop bandwidth is given to one of the parallel circuits, which is connected to the inputs of the lowpass filters LPF. A gain of $(\omega_1-\omega_2)$ is given to the other parallel circuit, which is connected in a crossed manner to the inputs of the lowpass filters LPF. The crossing path from the first axis to the second axis is connected in an additive fashion to the lowpass filter LPF, and the crossing path from the second axis to the first axis is connected in a subtractive fashion to the lowpass filter LPF.

The circuit which includes the same lowpass filter LPF as that shown in FIG. 3 and crossed feedback loops for $\omega_1$ serves as a bandpass filter, and is the same as the filter described with reference to FIG. 1 where ω is replaced with $\omega_1$. Specifically, the filter includes integrators disposed in respective signal paths of the axes and each having a negative feedback loop whose gain is "a" that is ½ of the passband width. The feedback loops from the integrators across each other between the x- and y-axes are arranged such that the feedback loop from the x-axis to the y-axis is a positive feedback loop, whereas the feedback loop from the y-axis to the x-axis is a negative feedback loop. If an angular frequency $\omega_1$ to be passed is a constant, then it is inserted as a gain into the feedback loops. If it is a time function, then it multiplies an output signal from the lowpass filter with a multiplier. The output of the bandpass filter as a whole is connected in an additive fashion to the directly connected signal path.

Figure 6:
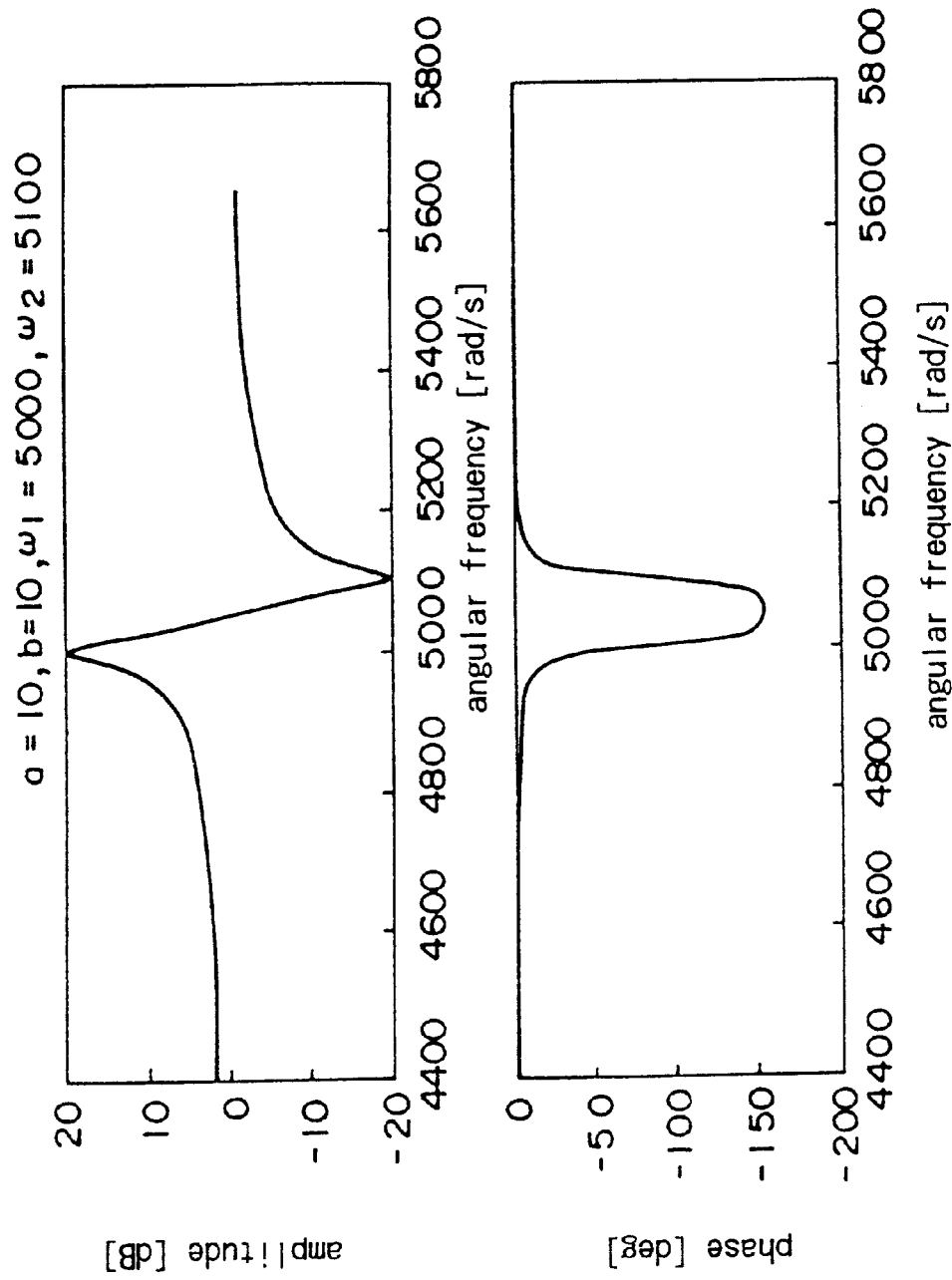

This circuit arrangement is effective particularly for an instance where $\omega_1 \approx \omega_2$, i.e., an instance only the mode of $\omega_1$ is to be selected and the mode of $\omega_2$ which is immediately close thereto is to remain untouched. A Bode diagram where a=b=10 [rad/s], $\omega_1$=5000 [rad/s], and $\omega_2$=5100 [rad/s] is shown in FIG. 6. Regardless of the fact that the frequencies are close to each other and a considerable bandwidth is occupied, the difference between pass and stop gains is about 40 [dB], indicating the effectiveness of the filter circuit. Furthermore, the circuit arrangement needs only two integrators.

Figure 7:
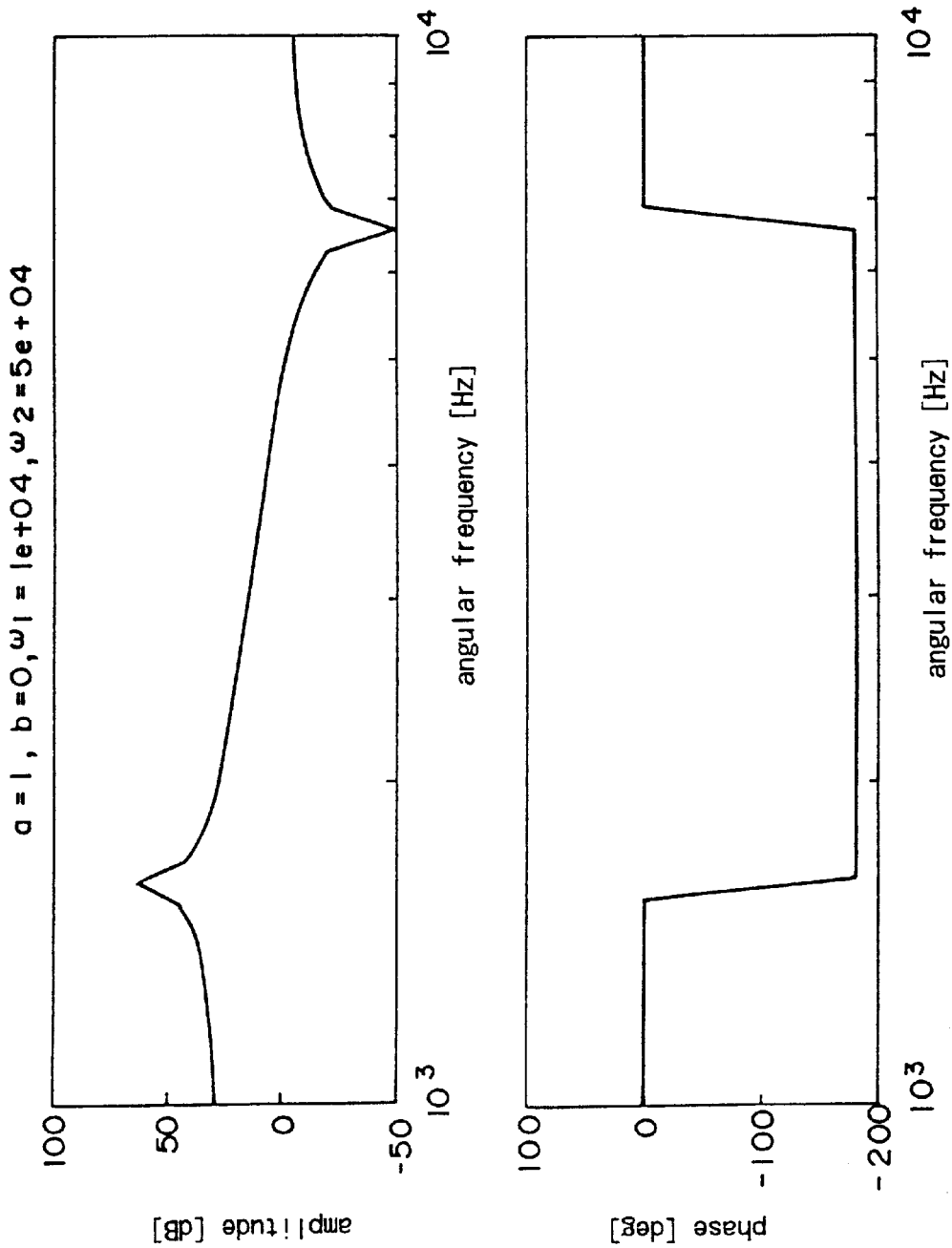

FIG. 7 shows an embodiment in which the phase angle of only a certain angular frequency band is delayed by 180 degrees not to affect the phase of another angular frequency range in the circuit shown in FIG. 5. In the diagram shown in FIG. 7, $\omega_1$=10000 [rad/s], $\omega_2$=40000 [rad/s], b=0, a=1 [rad/s]. By setting "a" to a value small enough to prevent oscillation, the phase is sharply reversed over the bandwidth between the angular frequencies. However, the gain characteristic is not made completely flat. If $\omega_1$ and $\omega_2$ are reversed, then the phase therebetween is advanced 180 degrees, and the gradient of the gain is also reversed.

An example in which a second-order lowpass filter whose transfer function has real coefficients and is expressed by the following equation is converted into a bandpass filter having a steep gain characteristic will be described below.

$$F_4=ka^2(s^2+2zas+a^2) \quad (16)$$

Figure 18:
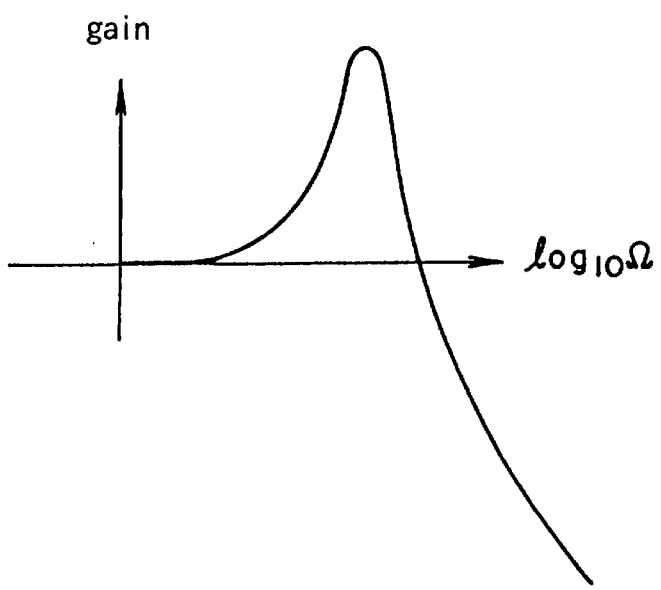
Figure 19:
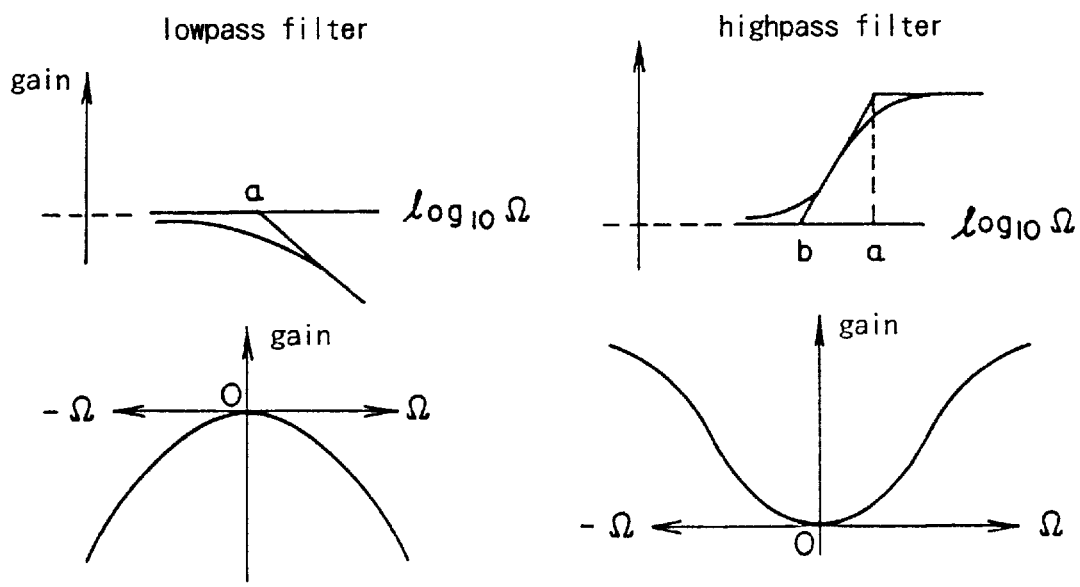

"z" of this filter function is usually called a damping ratio. It is customary to set "z" to z<1 to provide a narrow, high hump at the corner as shown in FIG. 18 for resonant characteristics. With such usage, since while a frequency range higher than the hump is somewhat steep, a frequency range lower than the hump has its bottom raised, it is general to multiply the numerator of the equation (16) by "s". However, the designing of hump configurations including the width of the hump is complex.

According to the present invention, steep characteristics can be obtained for a second-order filter, not only a bandwidth but also hump configurations can be selected freely, and also the positive or negative value of a passband can be selected freely.

If "s" in the equation (16) is replaced with (s–jc) in order to use an arbitrary central angular frequency c, which may be either positive or negative, as a reference, then the relationship between input and output signals U, V is given by multiplying both sides by the denominator including a complex number, as follows:

$$ka^2U=\{(s-j\omega)^2+2za(s-j\omega)+a^2\}V=\{s^2+2zas+a^2-\omega^2)-2j(\omega s+za\omega)\}(Vx+jVy) \quad (17)$$

Since the real part and the imaginary part of this equation are equal to each other, the following equations are obtained:

$$\{ka^2Ux-2(\omega s+za\omega)Vy\}/(s^2+2zas+a^2-\omega^2)=Vx \quad (18)$$

$$\{ka^2Uy+2(\omega s+za\omega)Vx\}/(s^2+2zas+a^2-\omega^2)=Vy \quad (19)$$

Figure 8:
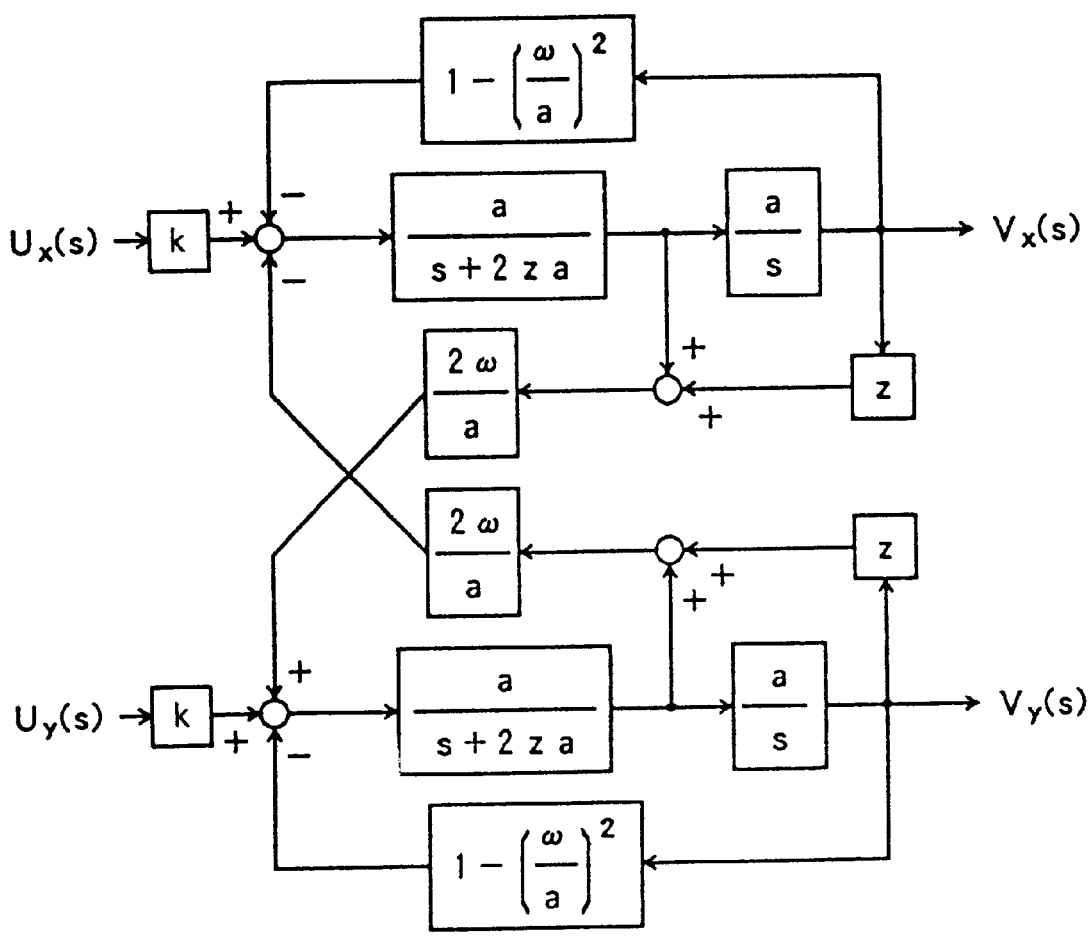

When the numerator and the denominator of the equations (18), (19) are divided by $a^2$, and the resulting equations are materialized, a complex second-order filter shown in FIG. 8 is realized. In the equations, ω is a constant, i.e., the case of fundamental frequency is not variable in the inverter device described above. If ω is variable, then ω in FIG. 8 needs to be supplied via separate paths and calculated by multipliers.

Figure 9:
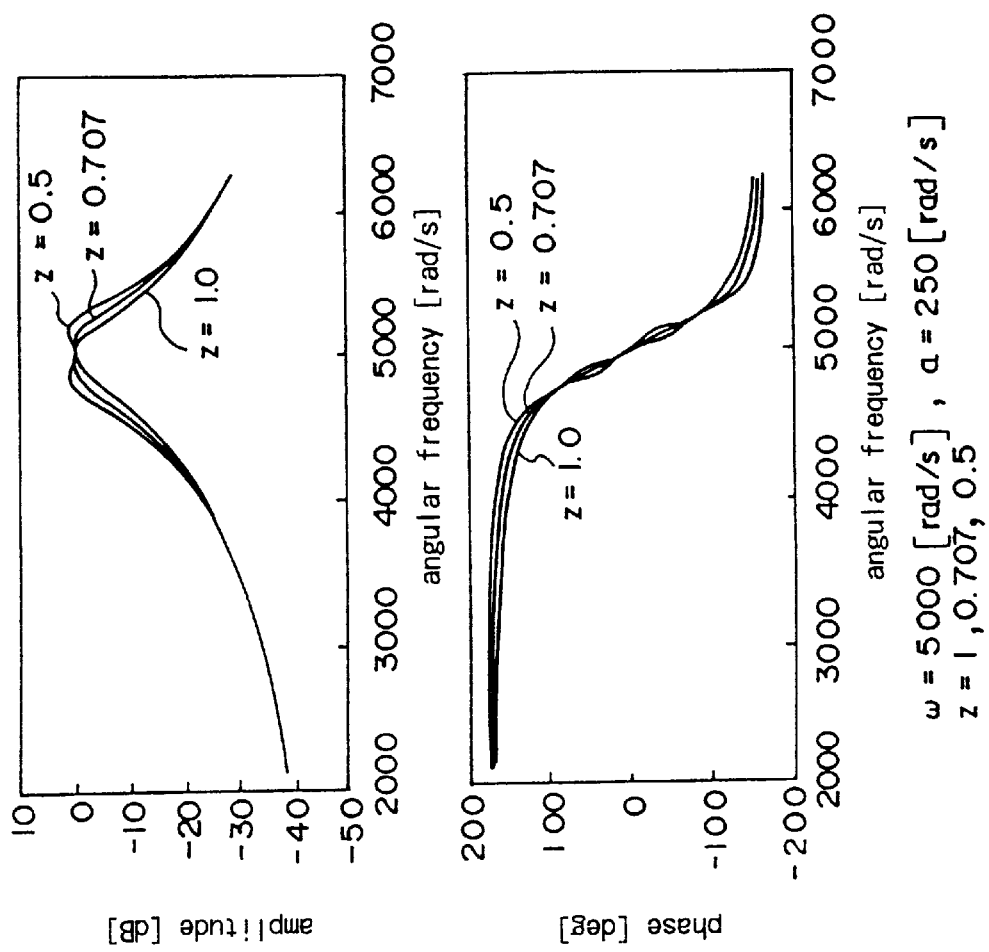

Both x- and y-axes are associated with second-order circuits, which are connected in a crossed fashion for highly sophisticated functions and performance. A Bode diagram where "z" is set to three values of 0.5, 0.707, and 1.0 for a=250 [rad/s], ω=5000 [rad/s], k=1 is shown in FIG. 9. In FIG. 9, horizontal coordinates are represented on a linear scale of angular frequencies. The bandwidth may be given as 2a, and appropriately selecting "z" is useful in improving a corner of the bandwidth. The gain characteristics are steeper as the bandwidth is smaller.

Figure 10:
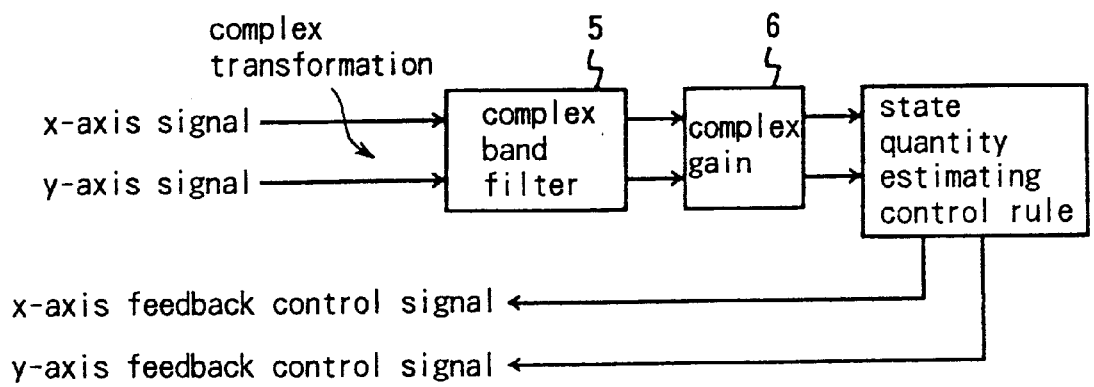

FIG. 10 shows still another embodiment of the present invention, which comprises a circuit for imparting a gain and phase for converting signals of the x- and y-axes into signals required for control. Necessary angular frequency components or bands are extracted from input signals from the orthogonal two axes, irrespective of whether they are positive or negative, a necessary phase is imparted to the angular frequency components or bands, which are outputted as output signals that are effective for control. At this time, a hypothetical coordinate system which rotates at an angular frequency to be extracted or removed may be assumed with respect to a stationary coordinate system, and selected components or bandwidth are extracted or removed as a DC component, and returned to the stationary coordinate system. The function of the circuit can be performed with a complex filter 5 shown in the left-hand side of FIG. 10. The complex filter 5 is a bandpass or bandstop filter described with reference to FIGS. 1 through 3 or a combination of such filters, and passes a different frequency or remove an unwanted nearby frequency component. If the frequency is variable, then it needs to be supplied via another path and calculated by a multiplier.

Figure 11:
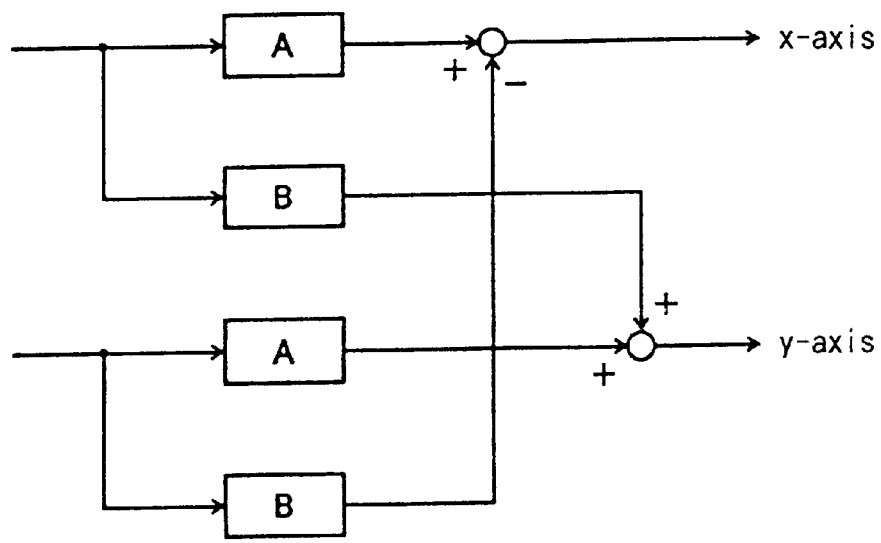

A complex gain circuit 6 shown in the right-hand side of FIG. 10 has signal paths of the two x- and y-axes branched, as shown in FIG. 11. A constant A is given as a gain to the signal paths of the two x- and y-axes, and a constant B is given as a gain to the branched paths, which are connected across each other to junctions at the signal paths behind the gain A. The crossing path from the x-axis to the y-axis is connected in an additive fashion to the junction, and the crossing path from the y-axis to the x-axis is connected in a subtractive fashion to the junction.

In the above complex gain circuit, the phase of an output signal can be increased or decreased irrespective of the input frequency, by an arbitrary phase angle $\tan^{-1}[B/A]$ by selecting the constants A, B arbitrarily. At this time, the gain is $(A^2+B^2)^{1/2}$.

Figure 12A:
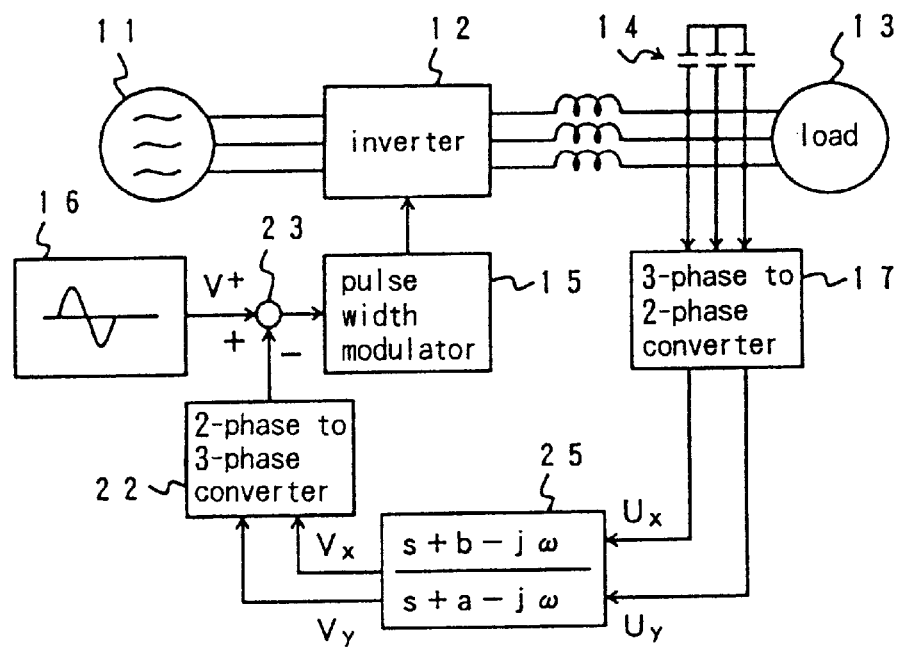
FIG. 12A is a block diagram of an apparatus for controlling inverter device according to an embodiment of the present invention.
Figure 12B:
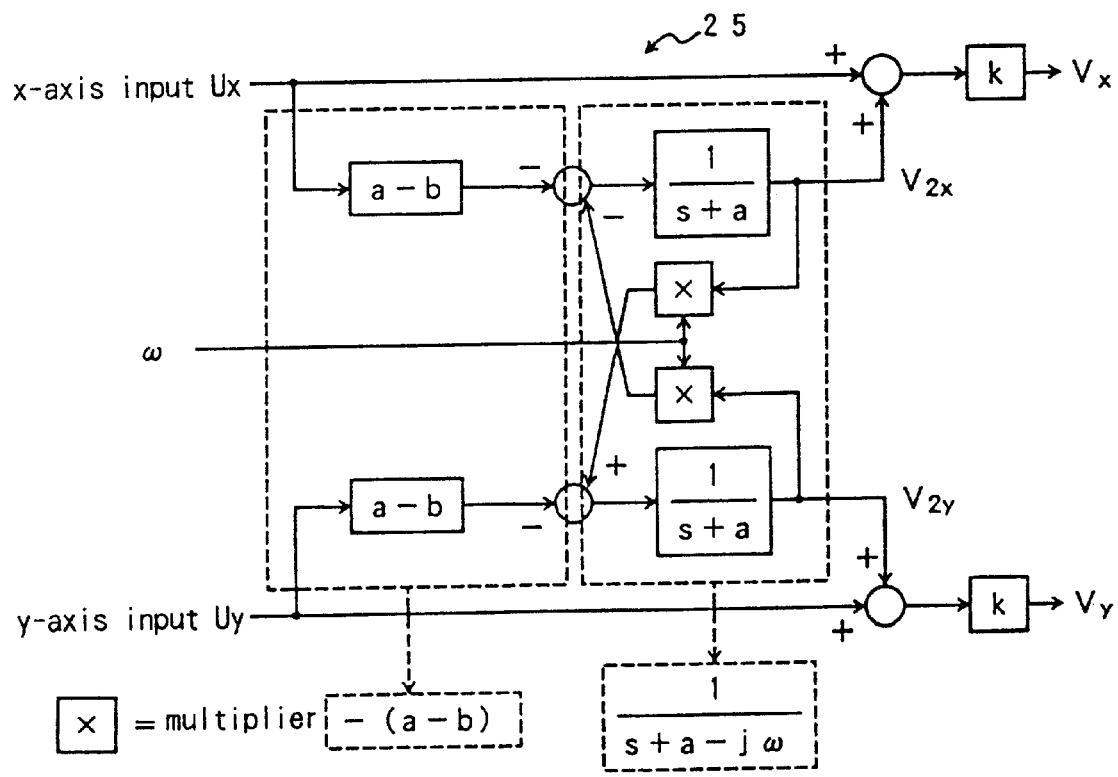
FIG. 12B is a block diagram of an orthogonal two-axis filter circuit.

Applications of the above arrangement of filter circuit to control apparatus are shown in FIGS. 12A and 12B. FIG. 12A shows an apparatus for controlling inverter device, and FIG. 12B shows a circuit arrangement in which an orthogonal two-axis filter circuit 25 shown in FIG. 12A is replaced with a real system. The orthogonal two-axis filter circuit 25 is inserted between the two three-phase/two-phase converters shown in FIG. 16, and makes any coordinate transformation circuits unnecessary. The orthogonal two-axis filter circuit 25 differs from the circuit arrangement shown in FIG. 16 in that it is controlled by ω(t), but not a command voltage θ(v), and the numerator is not set to "s", but (s+b). The reasons for such differences are that a slight delay in signal transfer is unavoidable if the filter circuit comprises a digital circuit, and since ω(t) which is actually generated may not necessarily be in full accord with ω(t) of a command voltage V⁺ and may tend to contain a small error, it is safer to give a small margin to the notch characteristics. The circuit itself is identical to the circuit shown in FIG. 3. Since $\omega_1=\omega_2$ in FIG. 5, the number of multipliers is reduced to half.

Figure 13:
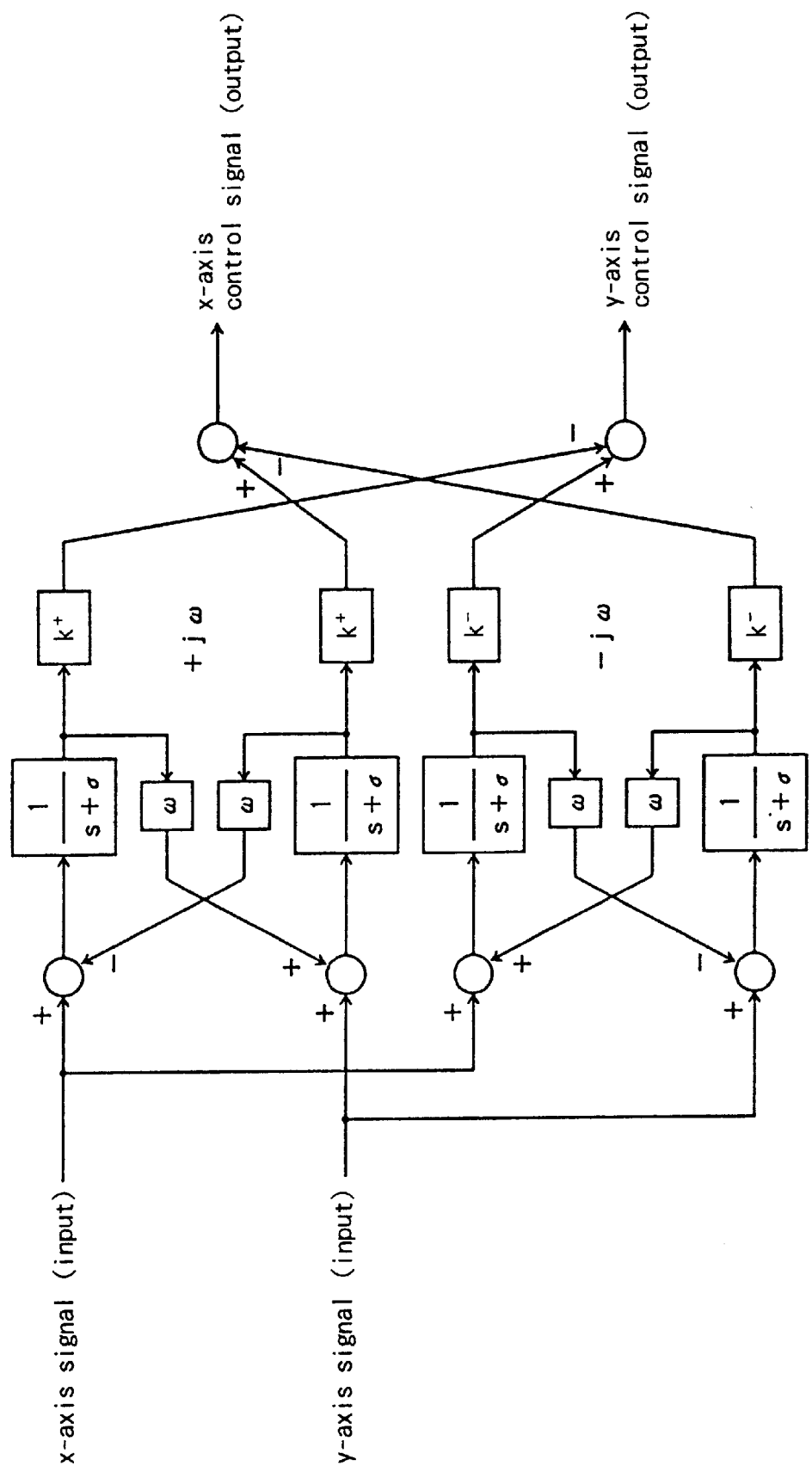

FIG. 13 shows a control apparatus for a magnetic bearing, illustrating a circuit for imparting damping in a situation where an object controlled by orthogonal two axes is represented by $1/(s^2+\omega_2)$ and there are two resonant modes of ±jω. The modes of ±jω are multiplied by individual gains to generate a control signal. For example, in the case of simplest harmonic oscillations, there are generated two oscillation modes, i.e., forward oscillation +ω and backward oscillation −ω, on an x-y plane under recovery forces. It is assumed that the modes are separately damped. For example, one of the modes may be left untouched because it has been damped by something else. It is assumed that damping having a gain of k⁺ is applied to a positive mode, and damping having a gain of k⁻ is applied to a negative mode. Since both oscillation modes are normal and reverse circular motions as viewed from stationary coordinates, the damping is given by applying forces tangential to the circle as braking forces.

If input signals x, y are signals from a displacement sensor to be controlled and a coordinate system is assumed which rotates at ω with respect to stationary coordinates in the positive mode, then the positive mode is stationary with respect to the coordinate system, and the negative modes rotates at −2ω with respect to the coordinate system, so that these modes can easily be separated. Therefore, as described above with respect to the inverter device, a DC component may be selected by coordinate transformation, and the selected DC component may be returned to the stationary coordinate system, so that the complex filter shown in FIG. 1 can be employed. Because ω is a constant, no multipliers are required, and ω is inserted as a gain in place of multipliers. Since only +ω is selected as a filter output signal, the tangential direction as a braking direction is a direction delayed perpendicularly or −j phase angle to the displaced direction, and hence is multiplied by a complex gain of −jk⁺. This corresponds to a specific example of the invention in claim 5.

Figure 14:
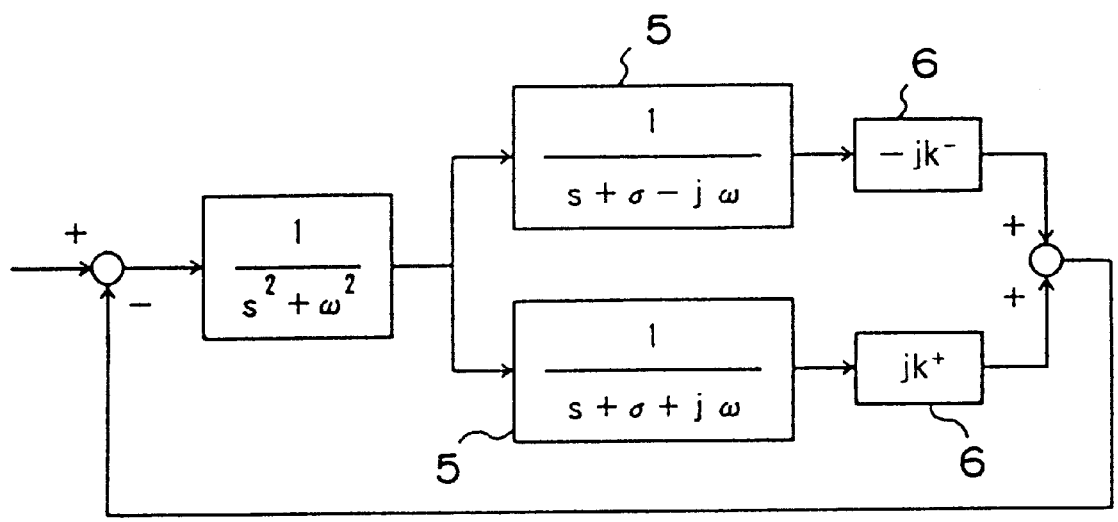

In the negative mode, the sign of ω in FIG. 1 is reversed, and the brake is multiplied by a complex gain of +jk⁻. For the complex gain circuit, A, B are set to A=0, B=+k⁺ in the positive mode, and to A=0, B=−k⁻ in the negative mode. Therefore, a signal of a frequency ω is subject to a phase change of −90 degrees and a gain of k⁺, and a signal of a frequency −ω is subject to a phase change of +90 degrees and a gain of k⁻. FIG. 14 is a complex representation block diagram where the dynamic characteristics of an object to be controlled in FIG. 13 is represented by $1/(s^2+\omega^2)$.

The complex gain circuit 6 may operate with a leading or lagging phase. Since the gain is free of dynamic characteristics, even when the phase is advanced, the gain is not increased if $(A^2+B^2)^{1/2}$ is not increased but the ratio B/A is maintained. A plurality of such frequency (band) selection paths may be provided as required, and a gain and phase required for stabilization may be imparted.

Figure 15:
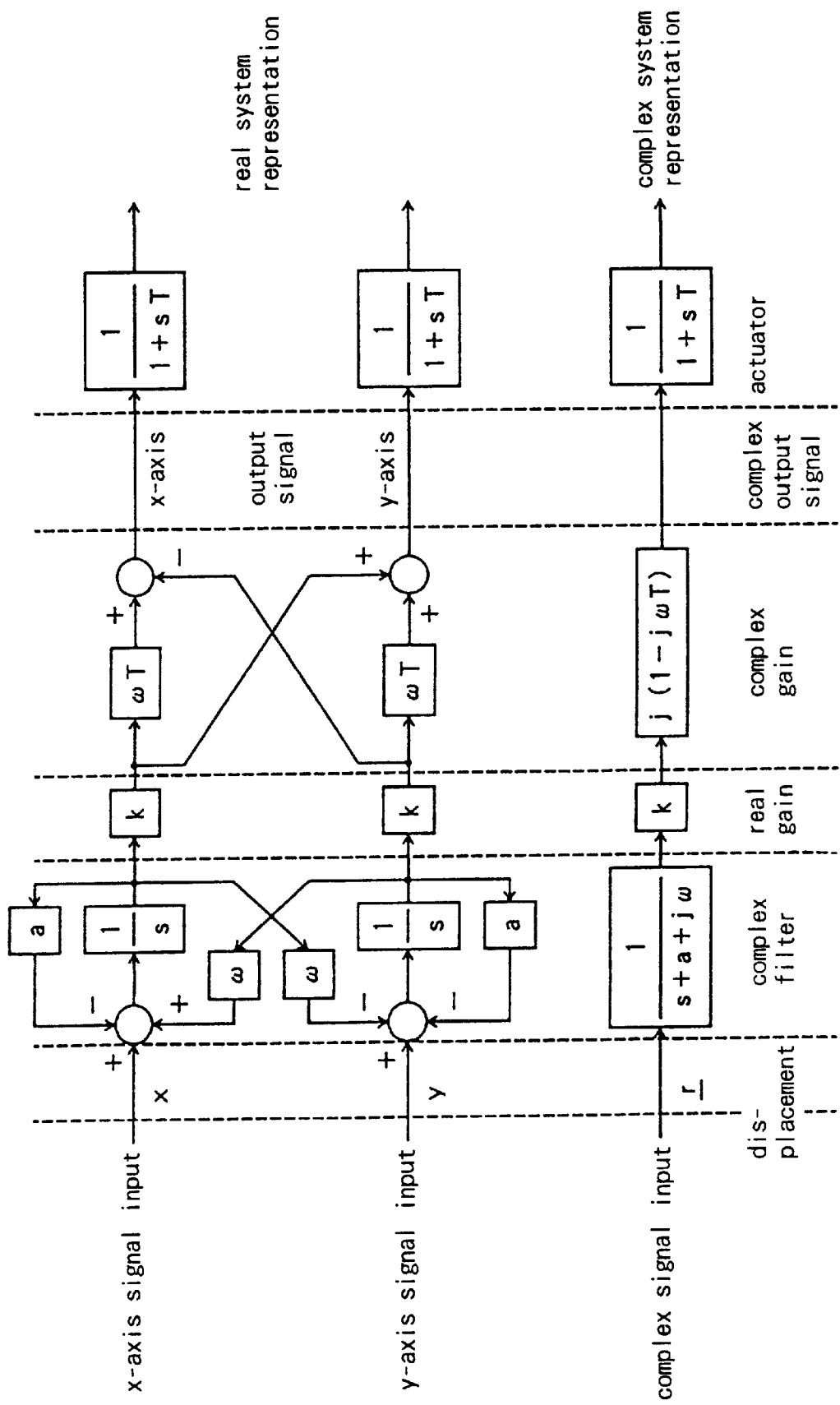

FIG. 15 shows an arrangement for a situation where an object to be controlled has the same dynamic characteristics as shown in FIG. 14, and an actuator at a final stage for generating control forces has a large time constant T. A transfer function of the lag is represented by 1/(1+Ts), and a +jω mode is sufficiently damped for some reason whereas a −jω mode is insufficiently damped. Therefore, only a component in the −jω mode may be selected, given a certain complex gain "k", and fed back.

A motion equation of the entire system containing the feedback loop, as it is Laplace-transformed, is expressed by:

$$s^2+\omega^2=k/[(1+Ts)(s+a+j\omega)] \qquad (20)$$

where k is an unknown complex number.

A characteristic equation of this system is expressed by:

$$F(s)=(s^2+\omega^2)(1+Ts)(s+a+j\omega)-k=0 \quad (21)$$

When converted into a Taylor expansion in the vicinity of $s=-j\omega$, it is approximated by;

$$F(s)|_{s=-j\omega}=-2j\omega a(1-1j\omega T)(s+j\omega)-k \quad (22)$$

Therefore, an approximate solution in the vicinity is given by:

$$s=-j\omega+k/\{-2j\omega a(1-j\omega T)\} \quad (23)$$

Since the second term on the right-hand side is a damping term, it is preferably a negative real number. Therefore, if $$k=j(1-j\omega T)k \quad (24)$$

then $$s=-j\omega-k/2\omega a \quad (25)$$

where k is a positive real number corresponding to a normal feedback gain.

Eventually, the equation (20) is expressed as follows:

$$s^2+\omega^2=jk(1-j\omega T)/\{(1+Ts)(s+a+j\omega)\} \quad (26)$$

In this equation, $(1-j\omega T)$ is newly added to the numerator in order to remove the effect of the first order lag. Specific connections of the numerator with a sensor output signal represented by x+jy are expressed by:

$$(x+jy)jk(1-j\omega T)=k[-y+x\omega T+j(x+y\omega T] \quad (27)$$

and illustrated in FIG. 15. With this arrangement, this control circuit passes only $-\omega$ of $\pm\omega$ with a selecting filter to compensate for a delay of an electromagnet for imparting damping.

According to the present invention, as described above, it is possible to provide various filter characteristics such as steep bandpass characteristics using a highpass or lowpass filter with respect to input signals of orthogonal two axes, without transformation from a stationary coordinate system into a rotating coordinate system and vice versa. Therefore, if the filter circuit according to the present invention is used in a feedback circuit of a control apparatus for an inverter device which generates a sine wave voltage, then the circuit arrangement of the feedback circuit can greatly be simplified, and good filter characteristics can be provided.

The filter circuit for orthogonal two-axis signals is capable of separating two modes in which frequencies are very close to each other in two-axis signals, or two modes of opposite signs in which their absolute values are equal or very close to each other, and is capable of selecting one of the modes only and estimating a state quantity thereof or effecting a given control law thereon. Accordingly, filtering can be carried out and a control signal can be generated so as to match operating conditions of two-axis signals, with a relatively simple apparatus or software, for thereby making more effective functions of controlling an inverter device whose basic AC frequency is variable, controlling a rotational motor, and controlling a magnetic bearing. The filter circuit or circuit system for signals of two rotating coordinate axes according to the present invention is capable of simultaneously adjusting a gain and a phase irrespective of the frequency, for effecting the control of an inverter device whose basic AC frequency is variable, the control of a rotational motor, the control of a magnetic bearing in a manner to match operating conditions thereof.

[The Present Invention According to a Second Aspect]

In a system for controlling, with electromagnetic forces or the like, radial orthogonal two axes (x- and y-axes) perpendicular to the rotational axis (z-axis) of a rotor, such as an axially symmetric magnetic bearing, a signal relative to the x-axis and a signal relative to the y-axis, such as signals representing the position and speed of a center of gravity for translational motion and signals representing a tilt angle and an angular velocity for tilting motion, are frequently handled as a real number and an imaginary number, respectively, and lumped together as a vector that is expressed by a complex number. For example, the position of a center of gravity is expressed by:

$$r=x+jy \quad (28)$$

and a tilt angle is expressed by:

$$\theta=\theta x+j\theta y \quad (29)$$

where θx, θy indicate tilt angles of the z-axis about the x- and y-axes, respectively. It is to be noted that the imaginary component is different from an imaginary part found in vector calculations for AC circuits, but is a physical quantity (sensor signal or control torque) relative to the y-axis, which can be detected and generated by a sensor and an actuator.

The above representation (a complex quantity is underscored) is simple, intuitive, and easy to understand because it allows two-input two-output systems to be handled as single-input single-output systems. When expressed by a differential equation, the order is reduced to half and eigenvalues are also reduced to half, while eigenvalues which do not exist are not present from the outset.

In such a complex variable system, a complex coefficient transfer function often appears. For example, for analyzing the frequency characteristics of a complex coefficient transfer function represented by a Laplace transformed form including a Laplace operator "s" expressed by:

$$F(s)=a/(s+a-j\omega) \quad (a, \omega \text{ are positive real constants}) \quad (30)$$

it is insufficient to replace "s" with $s=j\Omega$ and vary $\Omega$ from zero to infinity. This is because in a complex system, the characteristics are generally not symmetric with respect to zero in positive and negative frequency ranges, and it is necessary to check not only a positive range of $\Omega$, but also a negative range of $\Omega$.

It is apparent that the above equation F(s) represents a resonant frequency because the denominator is minimum when $$\Omega=\omega \quad (31)$$

If $\omega=0$ in the equation (30), then F(s) is a first order lag of a real system. By substituting $s=j\Omega$ in F(s), it is modified as follows:

$$F(j\Omega)=a/\{j(\Omega-0)+a\} \quad (32)$$

This equation makes it easy to understand the expansion of a real system transfer function into a complex system. Specifically, if $\omega \neq 0$, then $$F(j\Omega)=a/\{j(\Omega-\omega)+a\} \quad (33)$$

and the point of symmetry only moves from zero to ω.

It is well known that the gain characteristic of a Bode diagram according to the equation (32) is approximated by a horizontal straight line of 0 dB and a broken line of −20 dB/dec having a corner at $\Omega-0=a$. The gain characteristic of a Bode diagram according to the equation (33) is similarly determined. Noting that the point of symmetry is $\Omega=\omega$, $$\Omega=\omega\pm a \tag{34}$$

represents a corner, and $2a$ represents a passband width. If $\Omega=\omega$ indicates an origin, then the gradient of the broken line is represented by $\pm 20$ dB/dec. Specifically, $$\Omega-\omega=x \tag{35}$$

is substituted in the equation (33), and the gain of a Bode diagram is determined as follows:

$$G=20 \log a+20 \log[x^2+a^2]^{-\frac{1}{2}} \tag{36}$$

At high frequencies $x^2 \gg a^2$, since $$G \approx 20 \log a - 20 \log x \tag{37}$$

the gradient of the broken line in a high frequency range with $\Omega=\omega$ being an origin is expressed by:

$$dG/d(\log x)=-20[dB/dec] \tag{38}$$

i.e., the gradient is $-20$ dB/dec, as described above.

According to a representation with an ordinary Bode diagram with $\Omega=0$ being an origin, the gradient is totally different. Specifically, since the denominator of the equation (38) is $d(\log \Omega)$, the gradient is indicated by:

$$dG/d \log \Omega=(dG/d \log x) \cdot (d \log x/d \log \Omega)=(dG/d \log x) \cdot \{\Omega/(\Omega-\omega)\}[dB/dec] \tag{39}$$

Therefore, at $\Omega \approx 0$, the gradient of the broken line approaches zero. In the vicinity of the corner, i.e., at a frequency whose $|\Omega-\omega|$ is slightly greater than "a", $$|\Omega-\omega| \geq a \tag{40}$$

the gradient is much steeper than the equation (38). This tendency manifests itself as $a \approx 0$, i.e., the bandwidth is smaller. For example, if the corner frequency is $\Omega=a+\omega=1000$ and $a=10$ (if the central frequency $\omega$ is shifted from zero to $1000-10=990$), then the gradient in the vicinity of the corner changes to a steepness which is 100 times ($=\Omega/a$) greater than if $\Omega=\omega$ is an origin, according to the equation (39). However, the steepness becomes gradually smaller, and at the skirt spaced remotely from the corner the gradient approaches to $-20$ dB/dec.

The above steep gain characteristic is derived from a first-order lowpass filter (LPF), but not based on the resonant characteristics of a second-order system, as with a biquad filter for normal communications.

A first-order complex filter comprises first-order filters in respective x, y paths, which are connected across each other, resulting substantially in a second-order filter. However, general-purpose filters for use in communications and control should be of a single-input single-output system which produces one output signal in response to one input signal.

A single-input single-output system may be converted into a two-input two-output system by supplying an input signal as an input signal of the x-axis, generating a signal that is 90° out of phase with the input signal with some means, and supplying the generated signal as an input signal of the y-axis.

Figure 20:
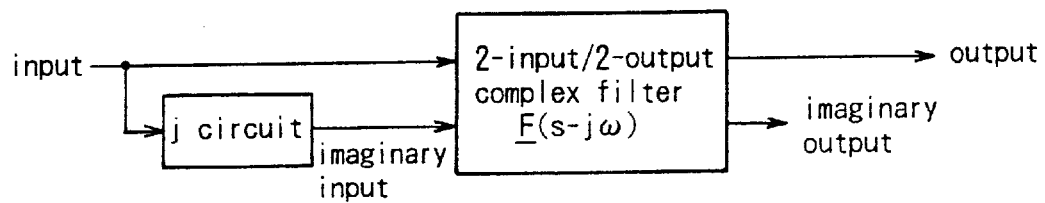

FIG. 20 shows connections for converting a complex filter circuit of a two-input two-output system into a general-purpose filter circuit of a single-input single-output system for use in communications/control. An input signal is supplied to a complex filter circuit of a two-input two-output system, and a signal that is 90° out of phase with the input signal is generated and supplied as another input signal to the complex filter circuit. A circuit for generating the signal that is 90° out of phase with the input signal is referred to as a j circuit. Specifically, such a j circuit may be constructed as:

1. an observer, or
2. an integrator having a gain $(-\omega)$ of $(-\omega/s)$ where $\omega$ is the central frequency of the filter, or an incomplete integrator. If $s=j\Omega$, then since $\Omega \approx \omega$ when the bandwidth is narrow, $-\omega/(j\Omega) \approx j$, making it possible to generate a signal which is 90° out of phase.

If a communication system or an object to be controlled is relatively simple, or a control system has already incorporated an observer, then the option 1 above is considered to be effective as the j circuit. The option 2 above is considered to be highly effective if the bandwidth of the filter is narrow. The incomplete integrator with small damping applied to the denominator is considered more practical. Several Bode diagrams which will be given subsequently are generated according to the option 2 above. If input and output signals for the imaginary axis of the complex filter are generated as imaginary input and output signals according to the above options, then such imaginary input and output signals may be expressed in the block diagram shown in FIG. 20.

For an integrator as the j circuit, if there is one pass or stop band, then the numerator of 1/s is preferably be multiplied by the central angular frequency $\omega$ thereof or a range from $\frac{1}{10}$ of the central angular frequency $\omega$ to 10 times the central angular frequency $\omega$, i.e., $$\omega/(10s)-10\omega/s$$

If there are a plurality of pass or stop bands, then the numerator of 1/s is preferably be multiplied by the average $\omega_0$ of their central angular frequencies or a range from $\frac{1}{10}$ of the average $\omega_0$ to 10 times the average $\omega_0$, i.e., $$\omega_0/(10s)-10\omega_0/s$$

If the j circuit is constructed as an incomplete integrator, then it is preferable to have $\delta$ in $$k\omega/(s+\delta)$$

as a small constant of $\frac{1}{10}$ of a gain $k\omega$ or less.

Figure 21:
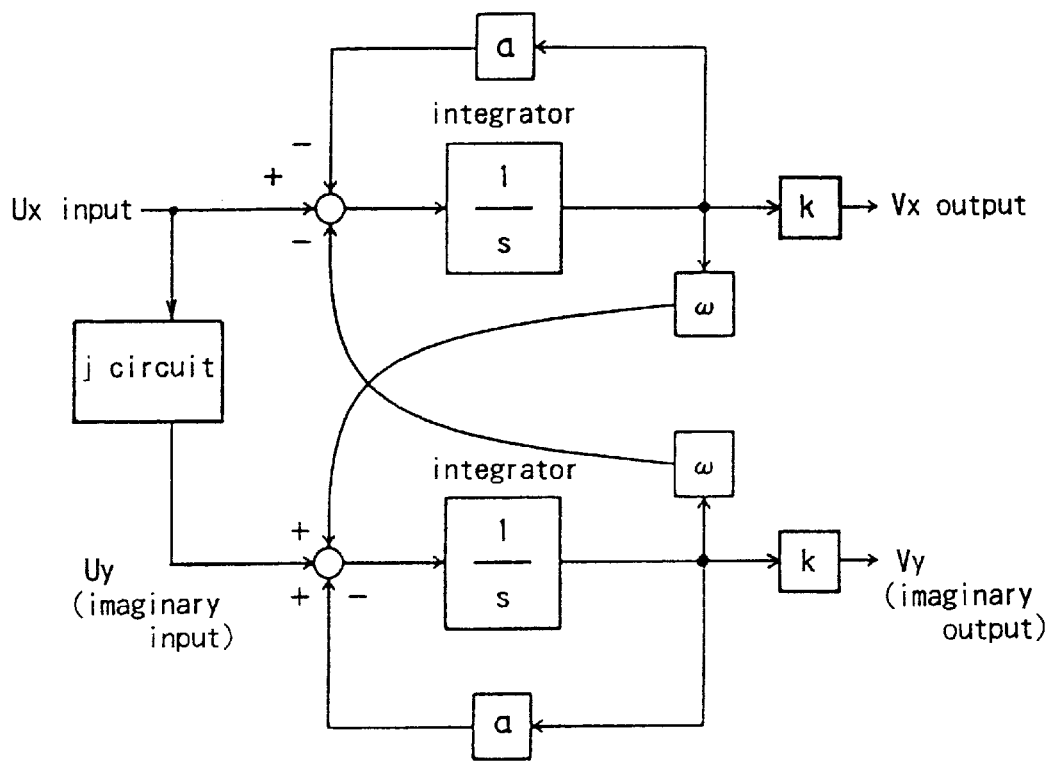

FIG. 21 shows a filter circuit according to a first embodiment of the present invention.

A specific circuit arrangement of an active filter for use in a general-purpose operational amplifier will be described below.

This circuit is constructed on the basis of a transfer function $F_1(s)$, shown below, of a first-order lowpass filter of real coefficients.

$$F_1(s)=k/(s+a) \tag{41}$$

If the Laplace operator "s" in the transfer function $F_1(s)$ is replaced with $(s-j\omega)$, producing a complex coefficient transfer function $F(s-j\omega)$, then when an input signal U is applied to the complex coefficient transfer function $F(s-j\omega)$, it produces output signals related to the x- and y-axes (whose quantities of Laplace transformation are represented by Vx, Vy, respectively) which are expressed by a complex variable $(V=Vx+jVy)$. A transfer representation equation expressed by:

$$U \cdot F(s-j\omega)=V \tag{42}$$

is represented by:

$$k(Ux+jUy)/(s+a-j\omega)=Vx+jVy \quad (43)$$

Both sides of the above equation are multiplied by $(s+a-j\omega)$ and expanded, and arranged into real and imaginary parts as follows:

$$kUx-aVx-\omega Vy=sVx \quad (44)$$

$$kUy-aVy+\omega Vx=sVy \quad (45)$$

When these equations are materialized, the filter circuit shown in FIG. 21 is realized. Specifically, the filter circuit comprises first-order low-pass filters including integrators 1/s disposed in respective signal paths of the x- and y-axes and each having a negative feedback loop whose gain is "a" that is ½ of the passband width. Output signals from the respective integrators are fed back across each other between the x- and y-axes. The feedback loop from the x-axis to the y-axis is a positive feedback loop, whereas the feedback loop from the y-axis to the x-axis is a negative feedback loop. These feedback loops have a gain representing an angular frequency ω to be passed, for selectively passing the angular frequency component.

Figure 22:
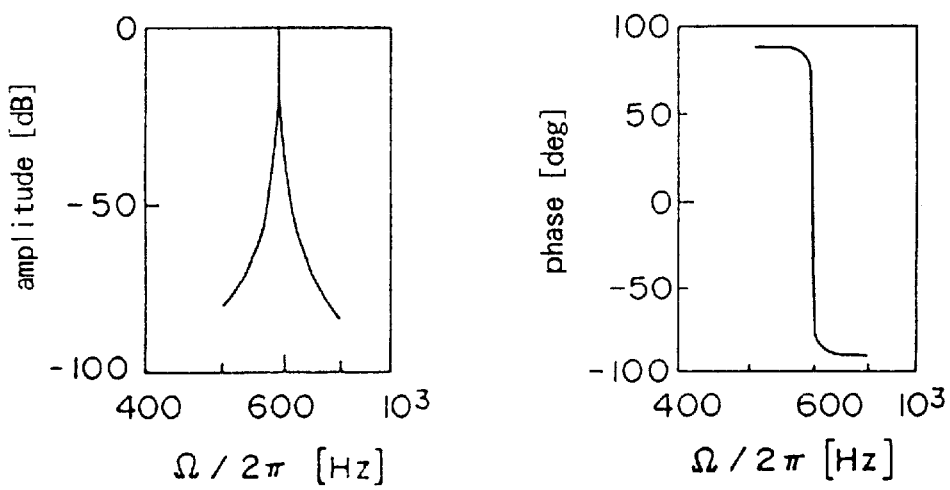

A Bode diagram where ω=3750 [rad/s] and a=7.5 [rad/s] in this embodiment is shown in FIG. 22. The Bode diagram shows an advantage in that a band including a central frequency is passed with a characteristic of sharp selectivity.

Figure 33:
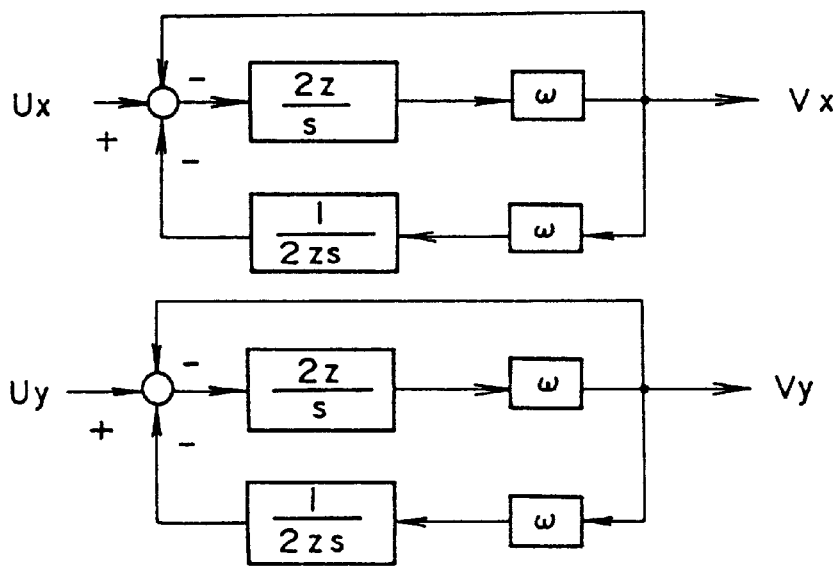
FIG. 33 is a diagram showing a conventional filter circuit.

A conventional biquad filter corresponding to the filter circuit shown in FIG. 21 is given by:

$$V=\{2z\omega s/(s^2+2z\omega s+\omega^2)\}U \quad (46)$$

where z is a dimensionless number imparting the steepness of a filter, which corresponds to the reciprocal of a damping ratio or selectivity. The equation (46) is a real system, and should be provided individually for each of the two x- and y-axes. A specific block diagram of the biquad filter is shown in FIG. 33. This filter requires two integrators for each of the axes, and hence a total of four integrators. With "z" being fixed, the steepness of the attenuation is constant in the Bode diagram. If the horizontal axis is on a linear scale, then the steepness falls in a high-frequency range.

For use as a tracking filter, therefore, it is necessary to reduce "z" as ω increases. Since ω is a variable, ω in the illustration needs to multiplied by multipliers. Because four multipliers are required, the cost of the filter is increased, and the calculation time is also increased. With the complex filter shown in FIG. 21, however, the bandwidth "a" remains unchanged, and "z" also remained unchanged. Therefore, the complex filter shown in FIG. 21 is simple and clear, comprises a hardware arrangement which is about half the conventional hardware arrangement, and requires a shorter calculation time for digital control.

Figure 23A:
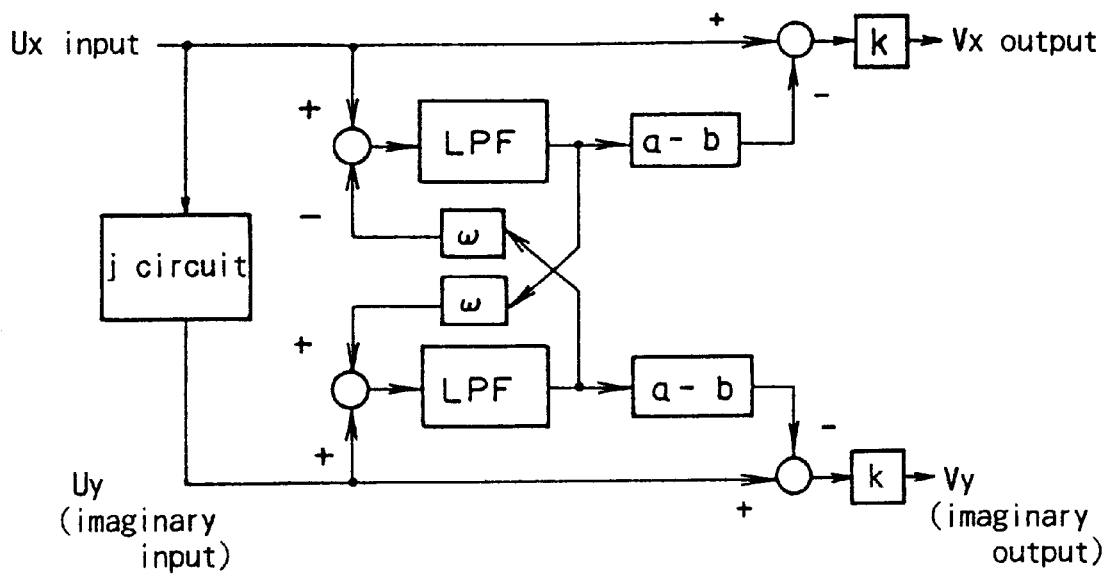
FIGS. 23A and 23B are block diagrams showing a second embodiment of the present invention.

FIG. 23A shows a second embodiment of the present invention, comprising a so-called notch filter for stopping only a signal having a certain angular frequency.

A real coefficient transfer function as a base for the notch filter is given by the following high-pass filter:

$$F_2(s)=k(s+b)/(s+a), a>b>0 \quad (47)$$

A complex coefficient transfer function is represented by $F_2(s-j\omega)$ that is given by replacing "s" with "s−jω" in the denominator and numerator of the above equation. Specific connections of the filter will be omitted here because they are a special case where $\omega_1=\omega_2=\omega$ in $F_3$ described later on.

When the above equation is materialized, the filter circuit shown in FIG. 23A is realized.

Figure 23B:
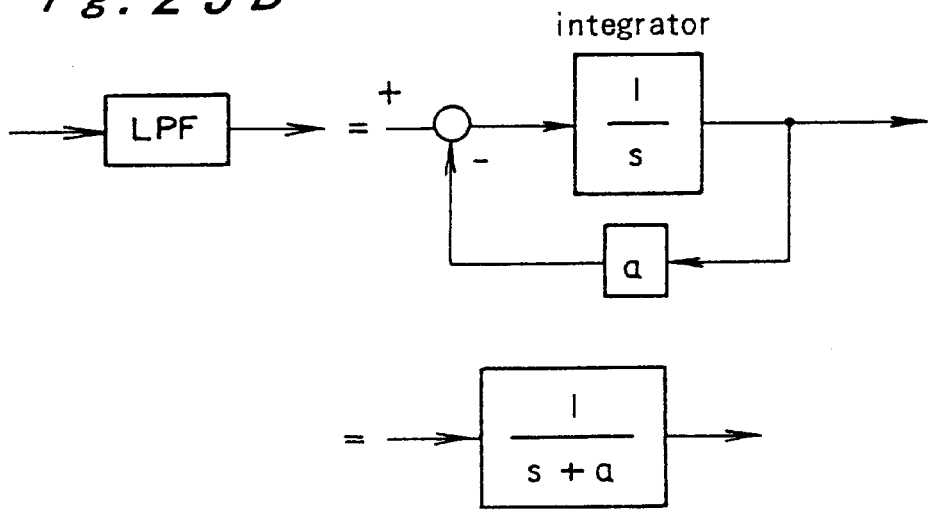
Figure 24:
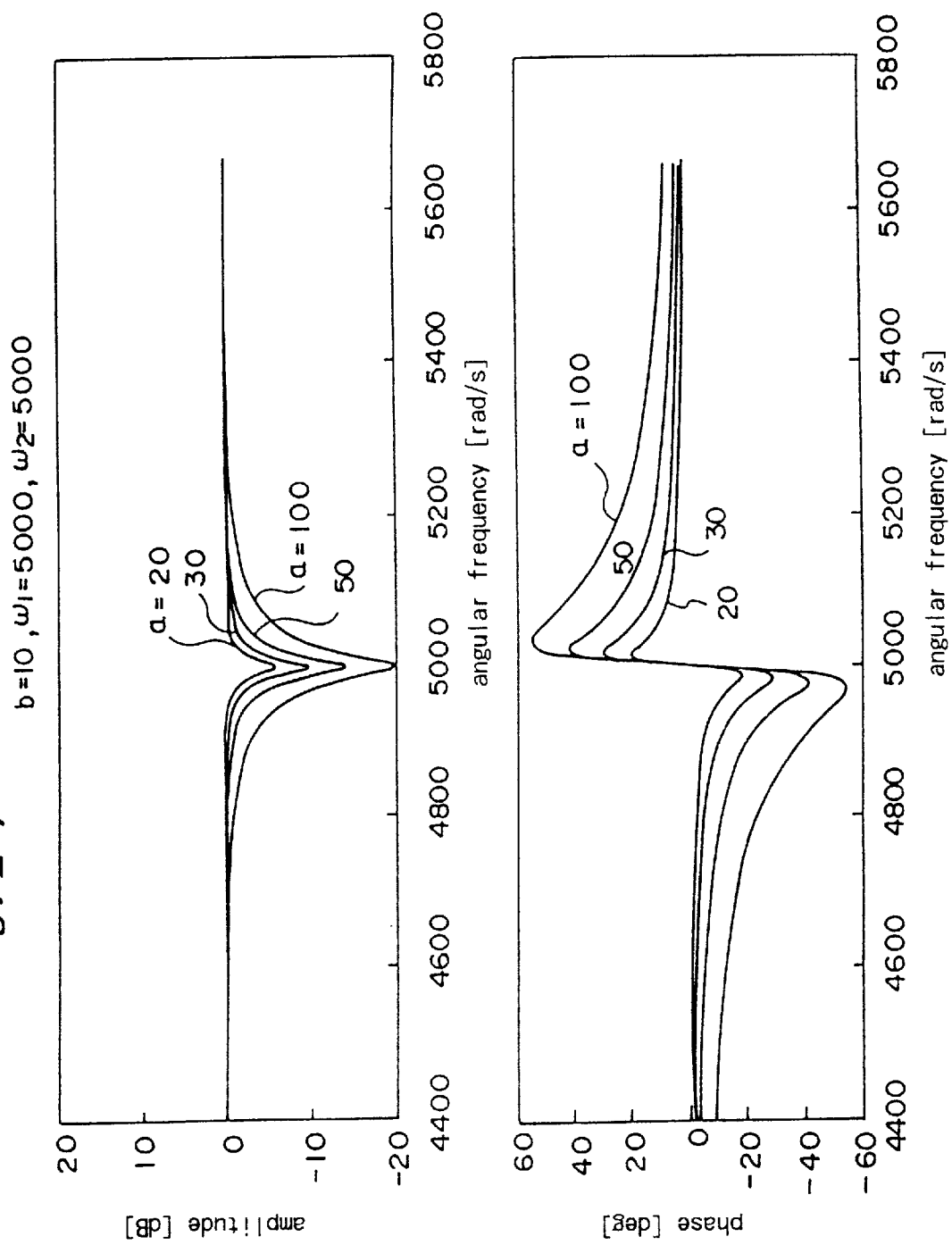

Specifically, the signal paths of the respective axes include directly connected signal paths each having a gain "k", and lowpass filters (LPF) are branched from and parallel to the directly connected signal paths. Paths for multiplying input signals by a gain (a−b), which is produced by subtracting "b" that is ½ of the stop bandwidth from a corner angular frequency "a" of the lowpass filters, and returning the products subtractively to the directly connected signal paths, are connected to the outputs of the lowpass filters. Crossing paths for feeding output signals of the lowpass filters back to the lowpass filters are connected across each other to the inputs of the lowpass filters. Each of the lowpass filters comprises an integrator and a feedback loop having a gain "a", as shown in FIG. 23B. To the crossing paths, there are applied an angular frequency ω, to be stopped, as a gain. The crossing path from the x-axis to the y-axis is connected in an additive fashion to the input of the lowpass filter, and the crossing path from the y-axis to the x-axis is connected in a subtractive fashion to the input of the lowpass filter. As a result, the angular frequency component signal is canceled and thence prevented from passing. The filter circuit is capable of compensating to ensure stable operation by stopping the passage of only the angular frequency ω, and imparting a suitable phase to the remaining signal. If b>a>0, then the filter serves as a bandpass filter, and if k=a/b, then the bottom of the skirt of the passing characteristics is 0 [dB]. Since only the phase changes, but the gain does not essentially change, in the vicinity of the outside of the stopband or passband (see FIG. 24), this feature can be used for control.

Figure 25:
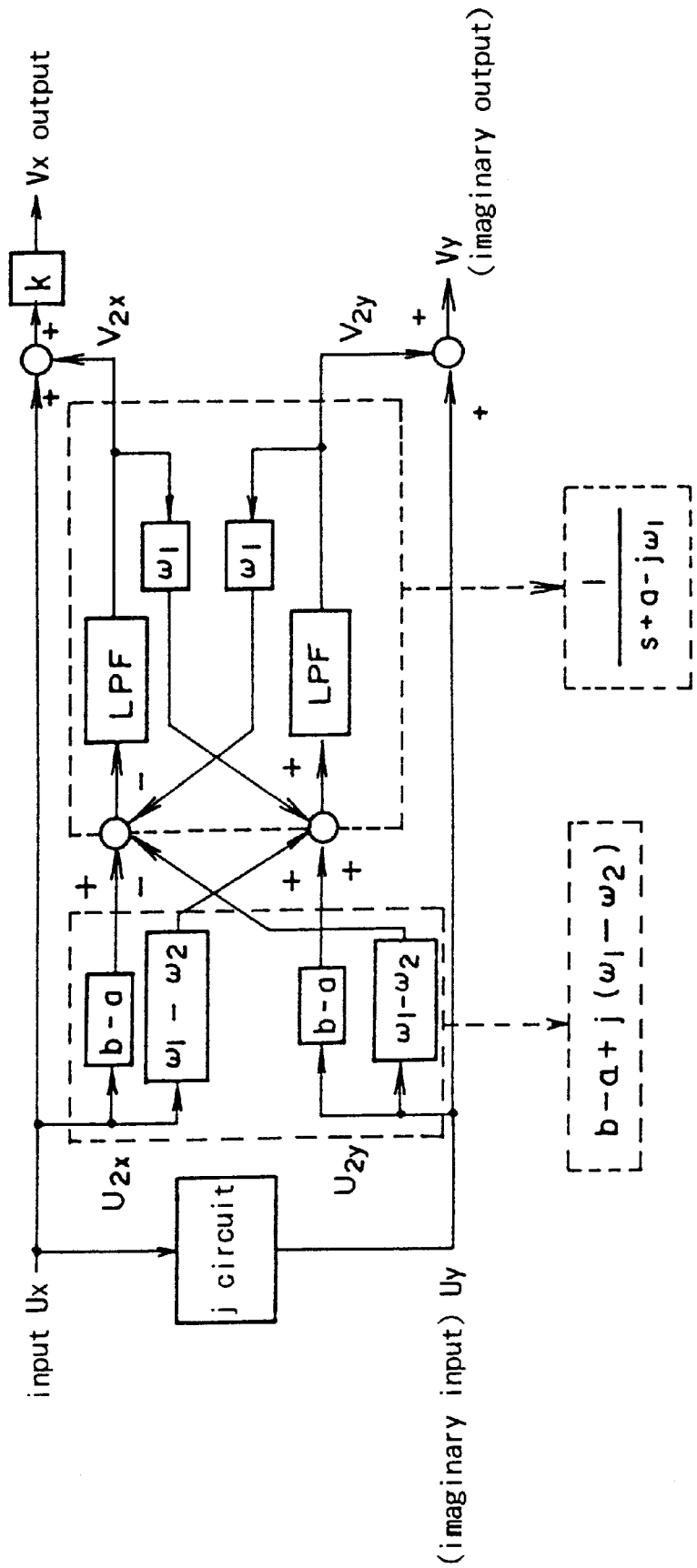
FIG. 25 is a block diagram showing a third embodiment of the present invention.

FIG. 25 shows a third embodiment of the present invention, which comprises a combination of the first and second embodiments, and is functionally equivalent of the two filter circuits connected in series to each other. Specifically, the filter circuit passes a angular frequency component $\omega_1$ required for a signal to control the two x- and y-axes and stops another angular frequency component $\omega_2$.

A transfer function where both the denominator and the numerator are of the first order is expressed as:

$$F_3=k(s+b)/(s+a) \quad (48)$$

"s" in the denominator and the numerator of the above equation is replaced with $(s-j\omega_1)$, $(s-j\omega_2)$, respectively, producing a complex coefficient transfer function represented by:

$$F_3=k(s+b-j\omega_2)/(s+a-j\omega_1) \quad (49)$$

The filter circuit according to the third embodiment is expressed by this equation. By reducing the order of the numerator, the equation (49) becomes:

$$F_3=k\{s+a-j\omega_1-a+b+j(\omega_1-\omega_2)\}/(s+a-j\omega_1)=k+k[\{b-a+j(\omega_1-\omega_2)\}/(s+a-j\omega)] \quad (50)$$

Therefore, the filter can be divided into a component which multiplies an input signal by "k" and passes the product therethrough, and a first-order lag element or lowpass filter including a complex constant of the second term. A process of constructing the second term only will be described below.

If $[\{b-a+j(\omega_1-\omega_2)\}/(s+a-j\omega_1)]$, which is obtained by removing "k" from the second term, is multiplied by an input signal $U_2=(U_2x+jU_2y)$, and the product is an output signal $V_2=V_2x+jV_2y$, then since the real and complex parts of a complex equation obtained after both sides are multiplied by the denominator are equal to each other, the following equations are satisfied:

$$U_2x(b-a)-U_2y(\omega_1-\omega_2)=V_2x(s+a)+V_2y\omega_1 \qquad (51)$$

$$U_2x(\omega_1-\omega_2)+U_2y(b-a)=V_2y(s+a)-V_2x\omega_1 \qquad (52)$$

From the equation (39), the following equation is obtained:

$$V_2x=[U_2x(b-a)-U_2y(\omega_1-\omega_2)-V_2y\omega_1]/(s+a) \qquad (53)$$

Similarly, from the equation (40), the following equation is obtained:

$$V_2y=[U_2x(\omega_1-\omega_2)-U_2y(b-a)+V_2x\omega_1]/(s+a) \qquad (54)$$

Multiplying the conjugate of the denominator of the equation (49) to convert the denominator into a real number would not be preferable because constituent elements would be increased, the order of the system would be increased, and the calculation time would be increased for digital control.

Connections according to the equation (53), (54) are indicated in portions other than the circuit portions for passing signals therethrough.

Specifically, signal paths of the x- and y-axes include directly connected signal paths each having a gain of 1 and two parallel circuits branched respectively from the directly connected signal paths. A gain of (b−a) which is produced by subtracting a corner angular frequency "a" of lowpass filters LPF connected thereto from ½ of the stop bandwidth is given to one of the parallel circuits, which is connected to the inputs of the lowpass filters LPF. A gain of $(\omega_1-\omega_2)$ is given to the other parallel circuit, which is connected in a crossed manner to the inputs of the lowpass filters LPF. The crossing path from the first axis to the second axis is connected in an additive fashion to the lowpass filter LPF, and the crossing path from the second axis to the first axis is connected in a subtractive fashion to the lowpass filter LPF.

The circuit which includes the same lowpass filter LPF as that shown in FIG. 23B and crossed feedback loops for $\omega_1$ serves as a bandpass filter, and is the same as the filter described with reference to FIG. 21 where $\omega$ is replaced with $\omega_1$. Specifically, the filter includes integrators disposed in respective signal paths of the axes and each having a negative feedback loop whose gain is "a" that is ½ of the passband width. The feedback loops from the integrators across each other between the x- and y-axes are arranged such that the feedback loop from the x-axis to the y-axis is a positive feedback loop, whereas the feedback loop from the y-axis to the x-axis is a negative feedback loop. An angular frequency $\omega_1$ to be passed is inserted as a gain into the feedback loops. The output of the bandpass filter as a whole is connected in an additive fashion to the directly connected signal path.

Figure 26:
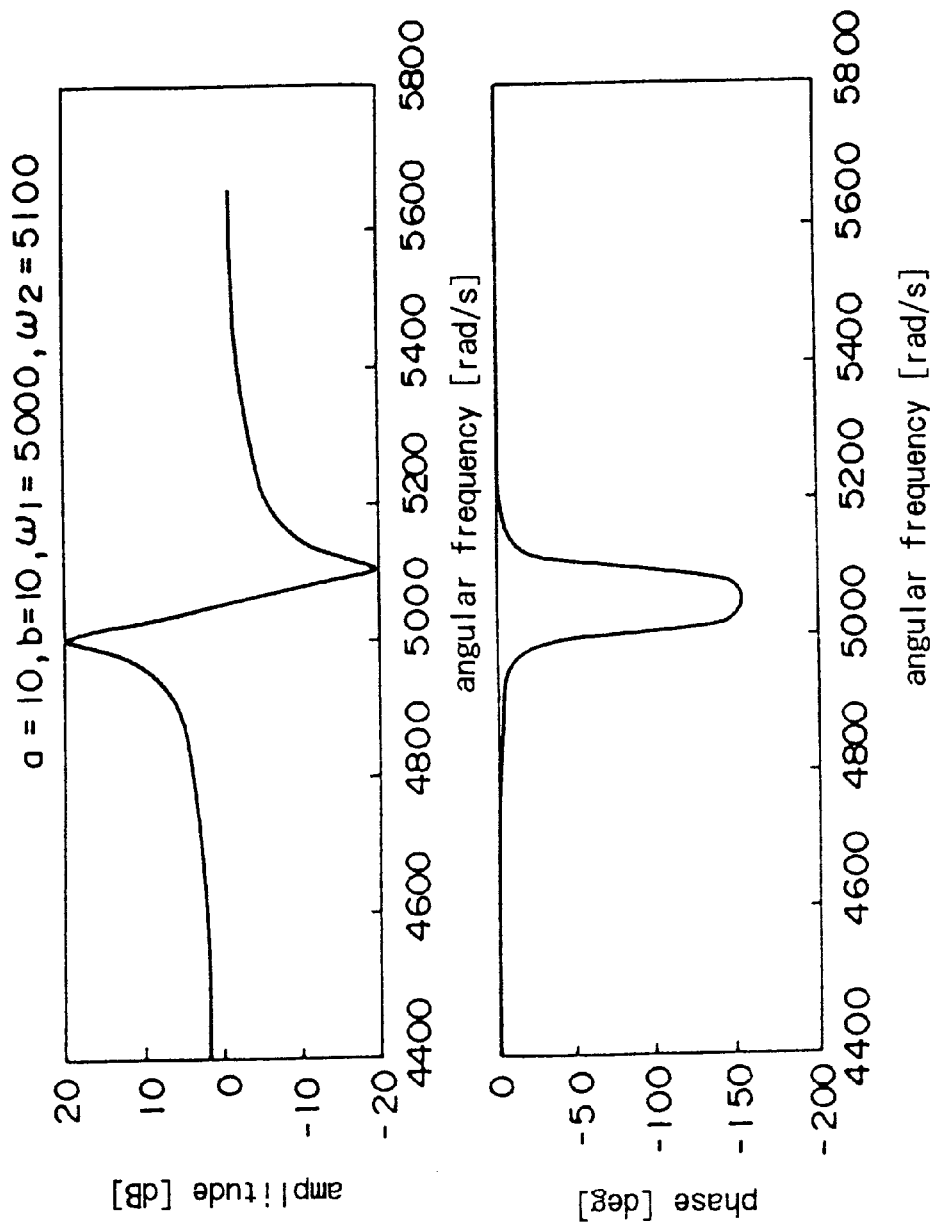
FIG. 26 is a set of graphs showing characteristics of a circuit according to the embodiment shown in FIG. 25.

This circuit arrangement is effective particularly for an instance where $\omega_1 \approx \omega_2$, i.e., an instance only the mode of $\omega_1$ is to be selected and the mode of $\omega_2$ which is immediately close thereto is to remain untouched. A Bode diagram where a=b=10 [rad/s], $\omega_1$=5000 [rad/s], and $\omega_2$=5100 [rad/s] is shown in FIG. 26. Regardless of the fact that the frequencies are close to each other and a considerable bandwidth is occupied, the difference between pass and stop gains is about 40 [dB], indicating the effectiveness of the filter circuit.

Figure 27:
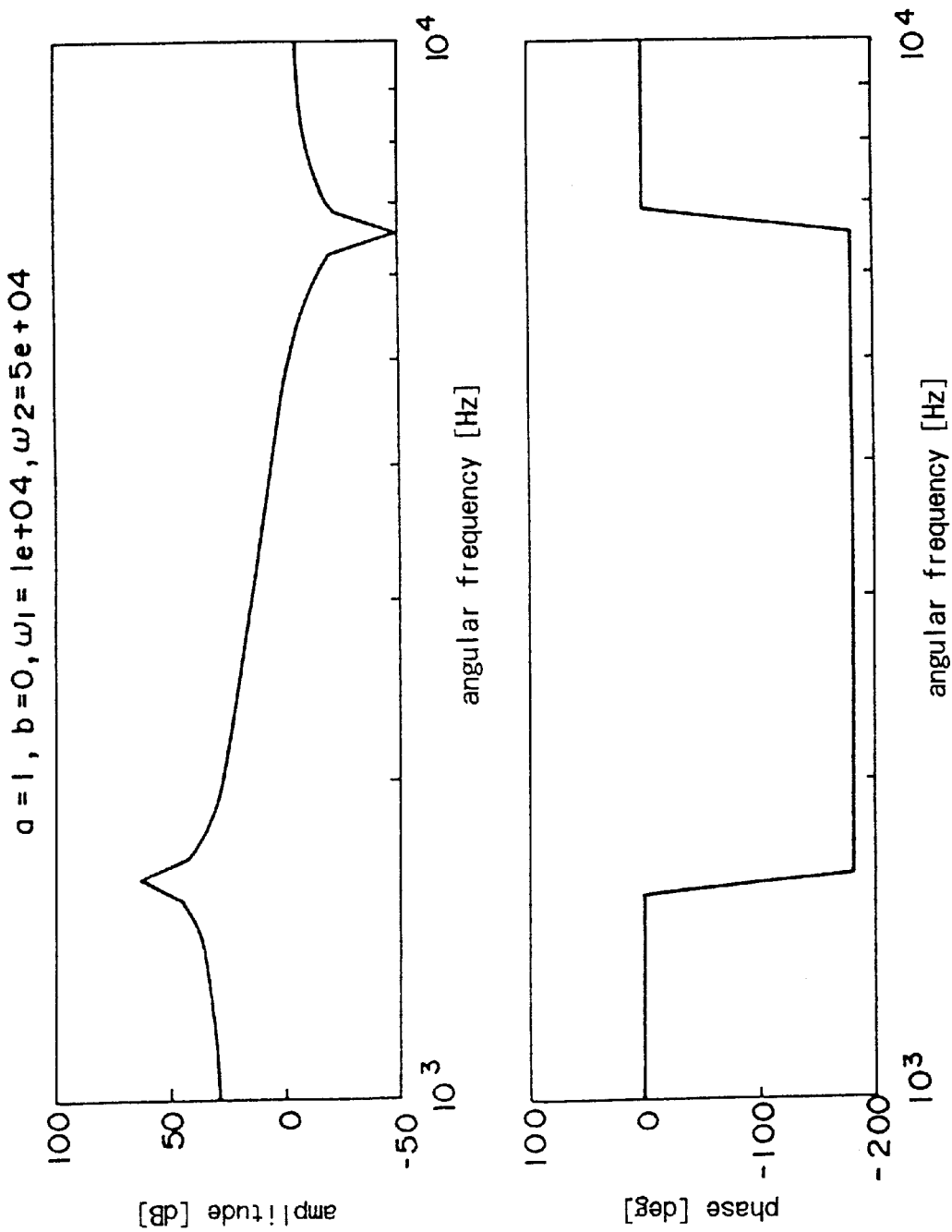
FIG. 27 is a set of graphs representing characteristics of another embodiment in which constants in the circuit according to the embodiment shown in FIG. 25 are varied.

FIG. 27 shows an embodiment in which the phase angle of only a certain angular frequency band is delayed by 180 degrees not to affect the phase of another angular frequency range in the circuit shown in FIG. 25. In the diagram shown in FIG. 27, $\omega_1$=10000 [rad/s], $\omega_2$=40000 [rad/s], b=0, a=1 [rad/s]. By setting "a" to a value small enough to prevent oscillation, the phase is sharply reversed over the bandwidth between the angular frequencies. However, the gain characteristic is not made completely flat. If $\omega_1$ and $\omega_2$ are reversed, then the phase therebetween is advanced 180 degrees, and the gradient of the gain is also reversed.

An example in which a second-order lowpass filter whose transfer function has real coefficients and is expressed by the following equation is converted into a bandpass filter having a steep gain characteristic will be described below.

$$F_4 = ka^2(s^2+2zas+a^2) \qquad (55)$$

Figure 34:
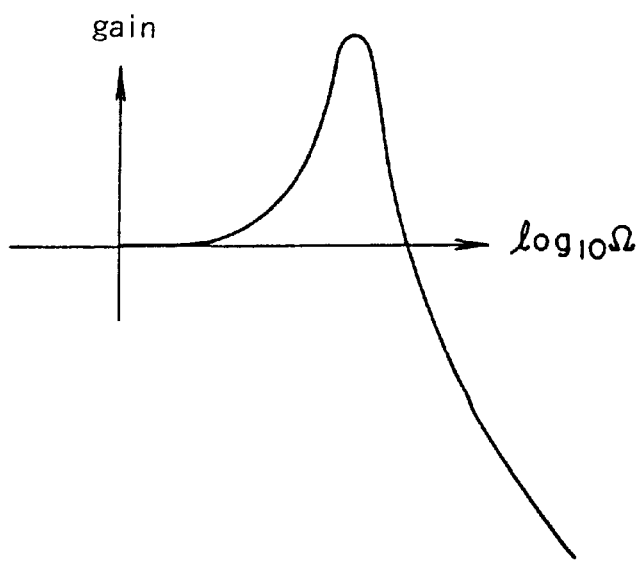
FIG. 34 is a graph showing a characteristic of a conventional second-order filter circuit.

"z" of this filter is usually called a damping ratio. It is customary to set "z" to z<1 to provide a narrow, high hump at the corner for resonant characteristics. With such usage, since while a frequency range higher than the hump is somewhat steep, a frequency range lower than the hump has its bottom raised, it is general to multiply the numerator of the equation (55) by "s". However, the designing of hump configurations including the width of the hump is complex (see FIGS. 33 and 34).

According to the present invention, steep characteristics can be obtained for a second-order filter, not only a bandwidth but also hump configurations can be selected freely. If "s" in the equation (55) is replaced with "s−jω" in order to use an arbitrary central angular frequency ω as a reference, then the relationship between input and output signals U, V, respectively is given by multiplying both sides by the denominator including a complex number, as follows:

$$ka^2U=\{(s-j\omega)^2+2za(s-j\omega)+a^2\}V=\{s^2+2zas+a^2-\omega^2\}-2j(\omega s+za\omega)\}(Vx+jVy) \qquad (56)$$

Since the real part and the imaginary part of this equation are equal to each other, the following equations are obtained:

$$\{ka^2Ux-2(\omega s+za\omega)Vy\}/(s^2+2zas+a^2-\omega^2)=Vx \qquad (57)$$

$$\{ka^2Uy+2(\omega s+za\omega)Vx\}/(s^2+2zas+a^2-\omega^2)=Vy \qquad (58)$$

Figure 28:
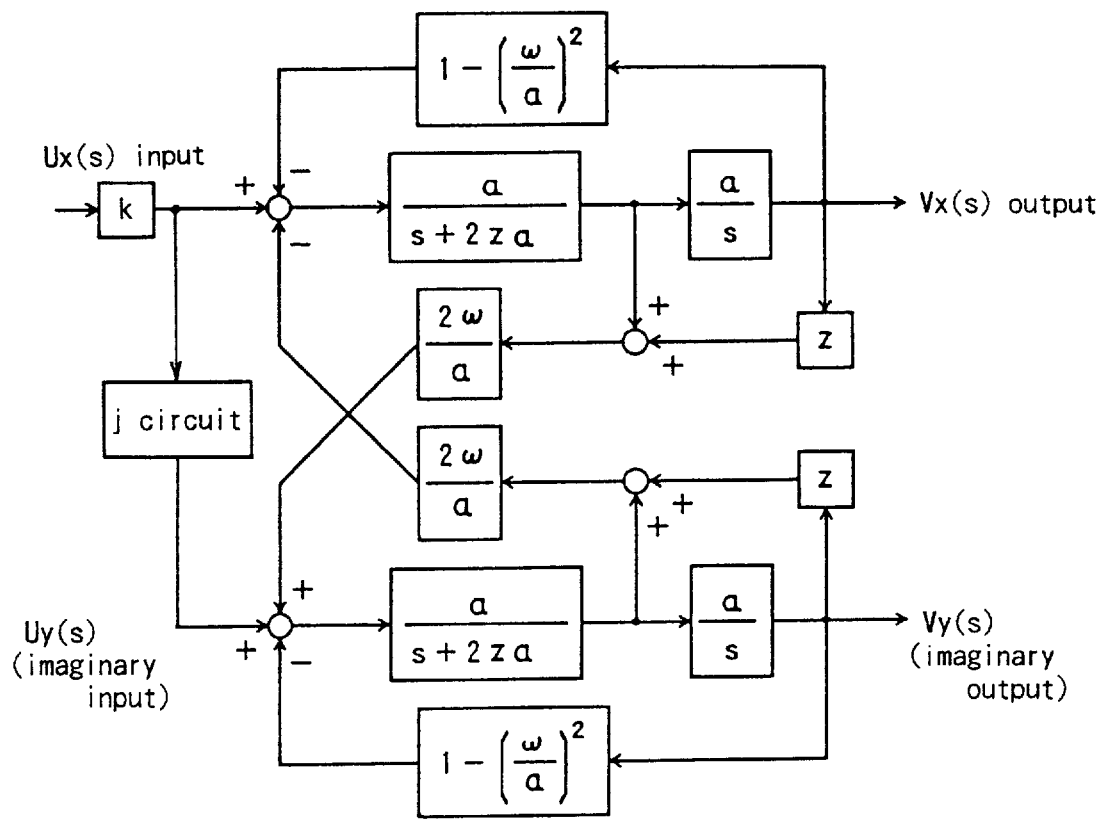
FIG. 28 is a block diagram showing a fourth embodiment of the present invention.

When the numerator and the denominator of the equations (57), (58) are divided by $a^2$, and the resulting equations are materialized, a complex second-order filter shown in FIG. 28 is realized.

Figure 29:
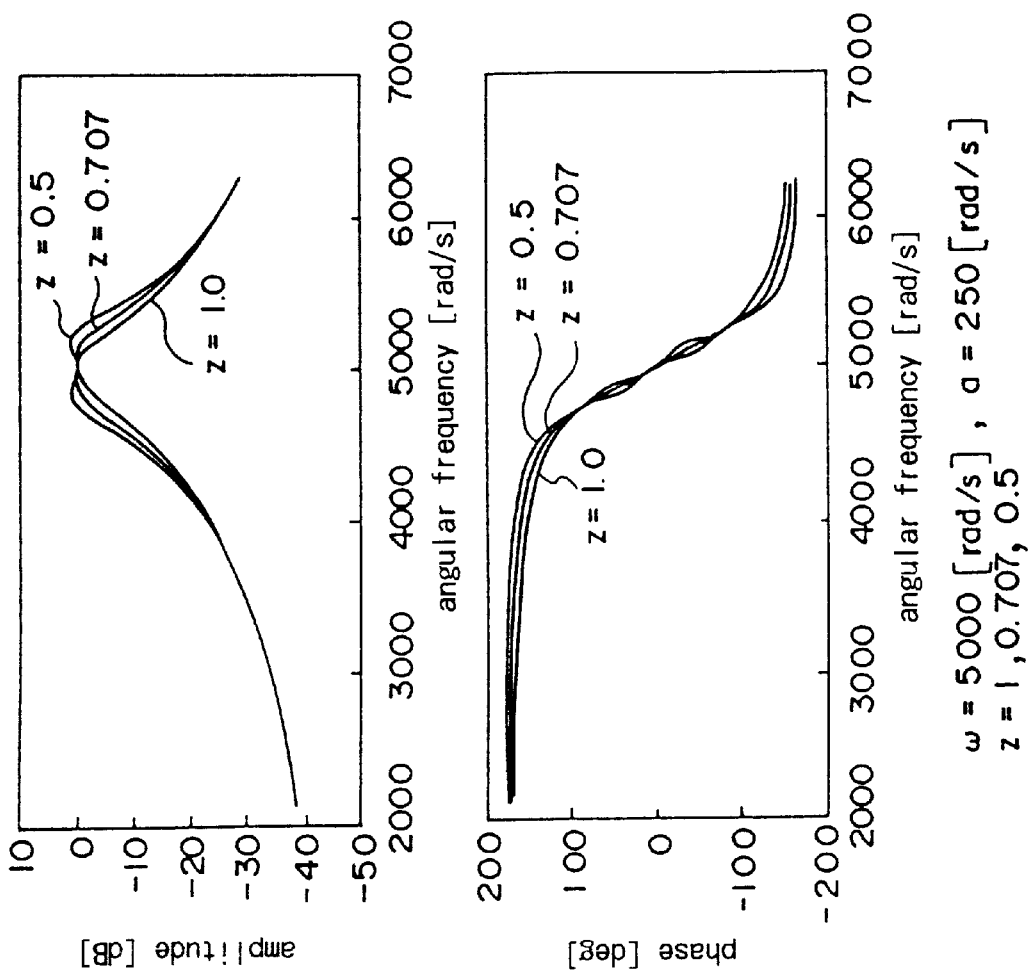
FIG. 29 is a set of graphs showing characteristics of a circuit according to the embodiment shown in FIG. 28.

Both x- and y-axes are associated with second-order circuits, which are connected in a crossed fashion for highly sophisticated functions and performance. A Bode diagram where "z" is set to three values of 0.5, 0.707, and 1.0 for a=250 [rad/s], ω=5000 [rad/s] is shown in FIG. 29. In FIG. 29, horizontal coordinates are represented on a linear scale of angular frequencies. The bandwidth may be given as 2a, and appropriately selecting "z" is useful in improving a corner of the bandwidth. The gain characteristics are steeper as the bandwidth is smaller.

Figure 30:
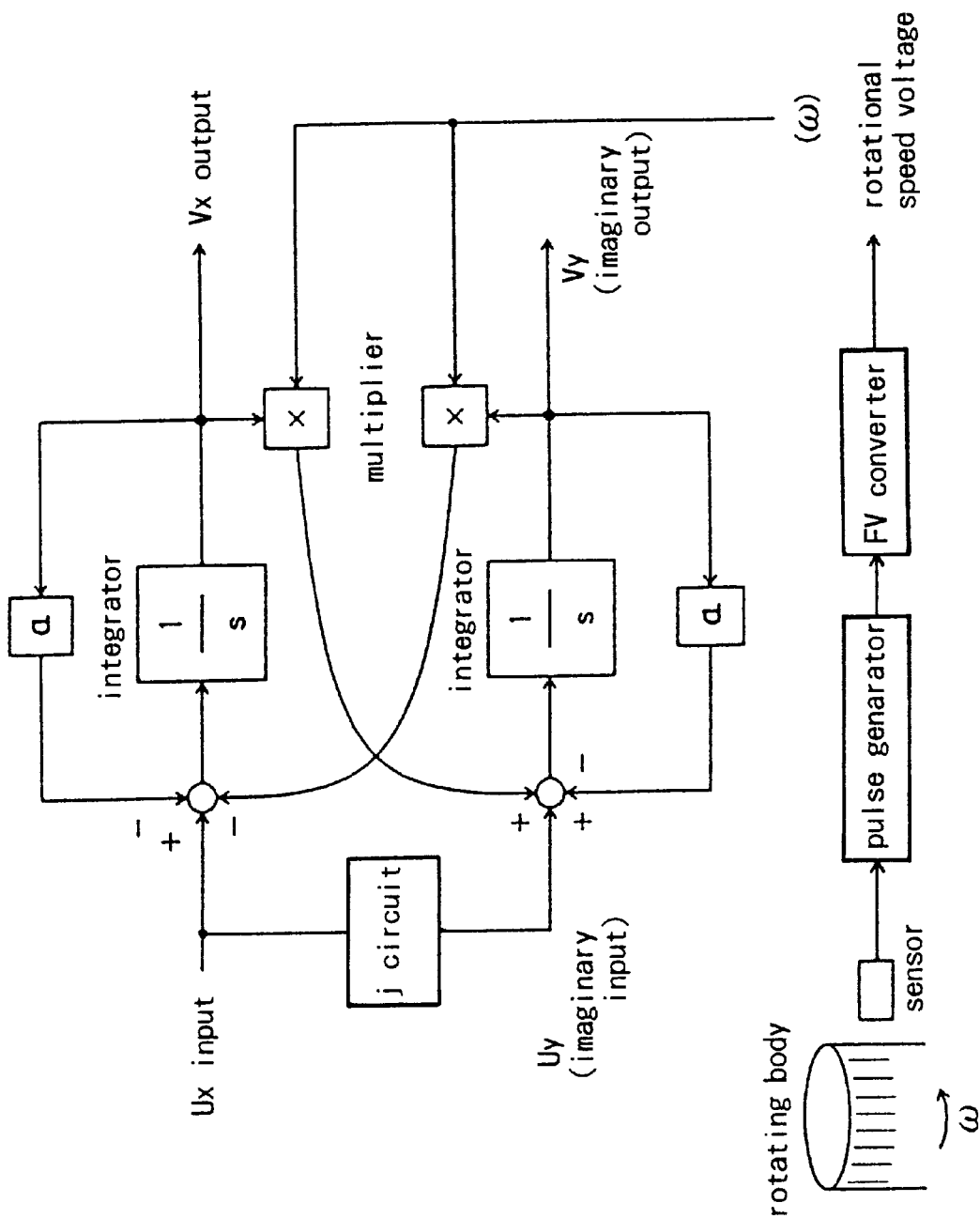
FIG. 30 is a block diagram of a tracking filter according to the present invention.

FIG. 30 shows an embodiment in the present invention is applied to a tracking filter. A tracking filter is used to extract a rotationally synchronized component to remove an oscillation component at the rotational speed or close thereto, or to increase the gain only in the vicinity of the rotational speed.

The tracking filter according to the present invention is similar to the bandpass filter described with reference to FIG. 21, except that ω which is fed back in a cross fashion is not a constant, but variable. Specifically, a signal from a sensor or a voltage signal corresponding to a rotational speed generated by a rotational speed sensor is supplied as a variable to multiply an output signal from an integrator. "a" which is fed back from the output signal from an integrator is ½ of the passband width, and serves as a lowpass filter and to prevent oscillation of a selected path. If "a" is reduced to a level including an error of the voltage corresponding to the rotational speed, then an unwanted signal such as noise other than a rotationally synchronized signal is reduced.

Figure 31:
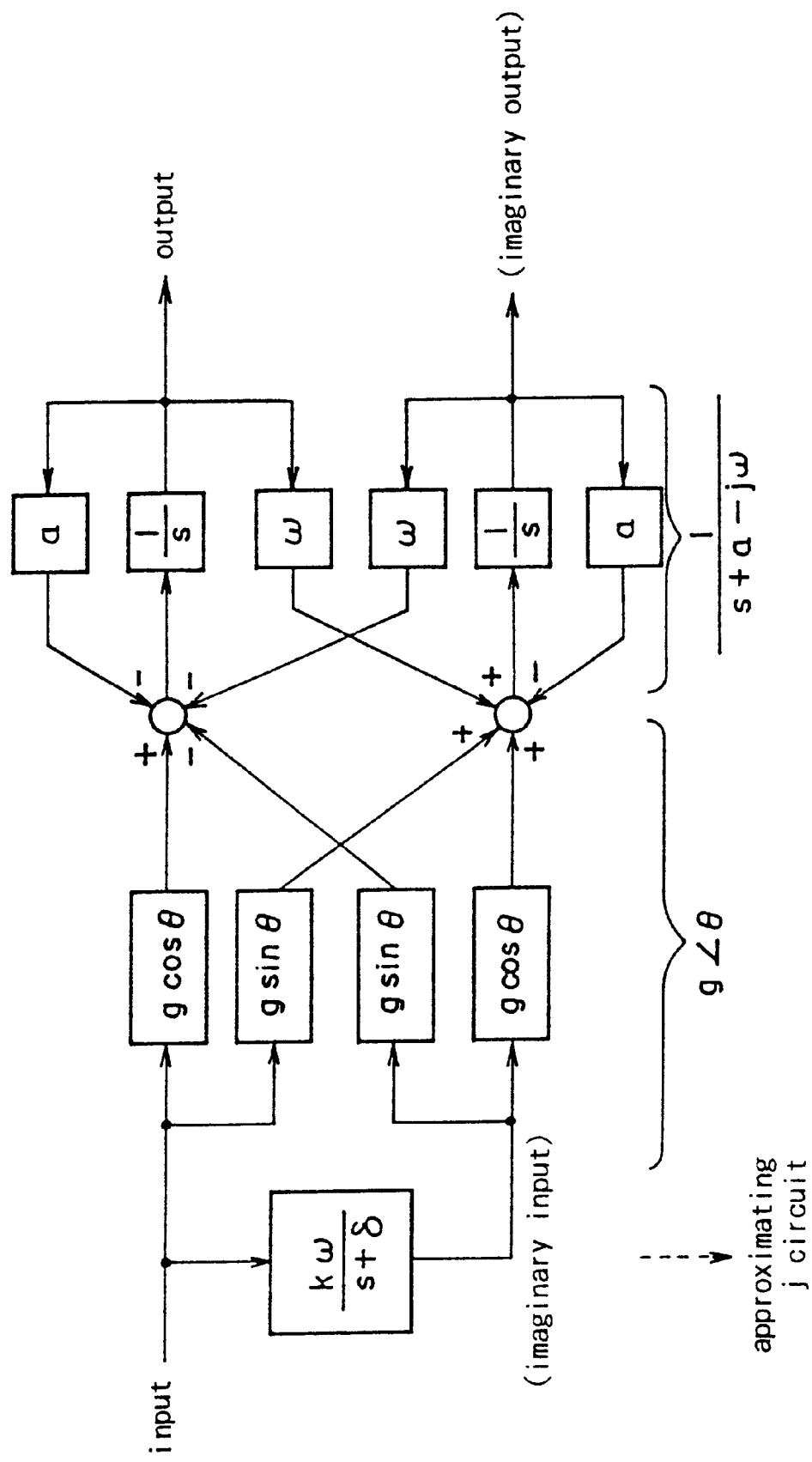
FIG. 31 is a block diagram showing a fifth embodiment of the present invention.

FIG. 31 shows an embodiment comprising a filter portion for extracting a necessary angular frequency component or a band component from an input signal with any of the above various complex coefficient transfer functions of the two-input/two-output system, and a complex gain portion for imparting a necessary phase angle to the extracted component. The complex gain circuit is represented by:

$$A = g \cos \theta$$

$$B = g \sin \theta$$

and has such a characteristic as $g\angle\theta$, with the gain and phase adjustable independently. In FIG. 31, a circuit $1/(s+a-j\omega)$ in the right-hand end comprises the bandpass filter circuit shown in FIG. 21. A j circuit in the left-hand end comprises an incomplete integration circuit represented by:

$$k\omega/(s+\delta)$$

where k is about 1/10, and $\delta$ is preferably 1/1000 of $\omega$.

Figure 32:
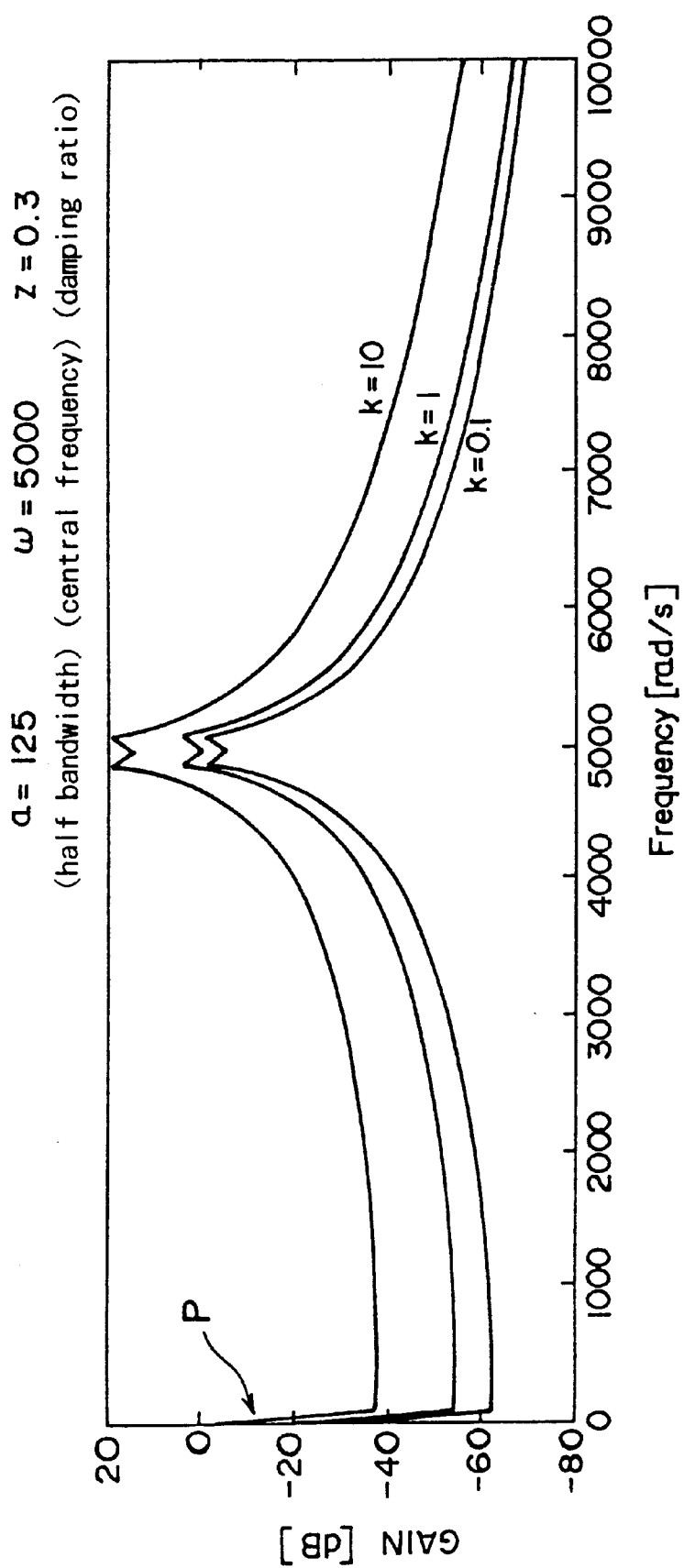
FIG. 32 is a graph showing characteristics of a circuit according to the embodiment shown in FIG. 28.

FIG. 32 shows an example of gain characteristics of the filter shown in FIG. 28 using the above approximating j circuit. As shown in the left-hand end of FIG. 32, the gain k is selected to lower peaks of a resonant mode P which are newly generated in low frequencies, for avoiding the effect of the resonant mode P. As "a" is reduced, the steepness is increased, reducing the effect of the generated low-frequency mode.

With the filter circuit for use in communications/control according to the present invention, it is possible to construct a general-purpose filter for use in communications and control of a single-input single-output system using excellent characteristics of a complex transfer function filter of a two-input two-output system. Consequently, a filter circuit of a single-input single-output system having steep bandpass filter characteristics, or notch filter characteristics, or phase shifting characteristics can easily be constructed of a lowpass or highpass filter of real coefficients and integrators.

Industrial Applicability

As described above, the invention according to the first aspect may be used as a filter circuit for orthogonal two-axis signals for the control of the rotational shaft of a motor, a pump, or the like.

The invention according to the second aspect may be used as a filter circuit of a single-output system for communications/control.

What is claimed is:

1. A filter circuit for orthogonal two-axis (x, y) signals wherein input signals related to orthogonal two axes (whose quantities of Laplace transformation are represented by Ux, Uy, respectively) are expressed by a complex variable U=Ux+jUy, a transfer function of a lowpass or highpass filter of real coefficients is represented by F(s), a central angular frequency to be passed or stopped is represented by $\omega$, a complex coefficient transfer function produced by replacing the Laplace operator "s" in the transfer function F(s) is represented by F(s−j$\omega$), and when the complex variable U is passed through the complex coefficient transfer function F(s−j$\omega$), output signals related to the orthogonal two axes (whose quantities of Laplace transformation are represented by Vx, Vy, respectively) are expressed by a complex variable (V=Vx+jVy), and a transfer representation equation is expressed by:

$$U \cdot F(s-j\omega) = V$$

characterized in that connections are made with a transfer element of real coefficients in order to equalize real and imaginary parts of the transfer representation equation after both sides of the transfer representation equation are multiplied by the denominator of F(s−j$\omega$), and $\omega$ is to multiply as an input signal from a separate path when it is a time function.

2. A filter circuit according to claim 1, characterized in that two positive or negative central angular frequencies to be passed or stopped are represented by constants or time functions $\omega_1$, $\omega_2$, respectively, with $\omega_1 \neq \omega_2$, and in order to pass a component including a bandwidth (2a) across $\omega_1$ at its center and stop a component including a bandwidth (2b) across $\omega_2$ at its center, and/or add a phase angle $\pm\pi$ across boundaries of $\omega_1$, $\omega_2$, said complex coefficient transfer function is represented by $k(s+b-j\omega_2)/(s+a-j\omega_1)$ or $k(s+b-j\omega_2)/\{(s-j\omega_1)^2+2za(s-j\omega_1)+a^2\}$ where k is an arbitrary gain or coefficient and z is an arbitrary dimensionless number.

3. A filter circuit according to claim 1, characterized in that the numerator and/or denominator of the transfer function F(s) includes a second-order system represented by $k(s^2+2zas+a^2)$ where k is an arbitrary real gain or coefficient and 2a represents a bandwidth with the central angular frequency $\omega$ to be passed or stopped, and regions near corners at opposite ends of the bandwidth of gain characteristics of frequency characteristics of the filter are brought closely to an ideal filter by replacing s with (s−j$\omega$) and selecting the dimensionless number z arbitrarily.

4. A filter circuit for orthogonal two-axis signals, comprising a plurality of filter circuits for orthogonal two-axis signals according to claim 1, for passing or stopping a particular band in an entire frequency range or adding a phase angle $\pm\pi$ across the central angular frequency as a boundary.

5. A filter circuit for orthogonal two-axis signals, characterized in that the complex coefficient transfer function of the filter circuit according to claim 1 is multiplied by a complex gain (A+jB) where A, B are real constants, for imparting an arbitrary gain and phase to a particular frequency range.

6. A control apparatus for an inverter device which outputs a sine wave voltage having an arbitrary frequency, wherein if the inverter device produces a polyphase output signal, then polyphase output signals are transformed into two-phase output signals of orthogonal two axes, and supplied to the filter circuit according to claim 1 to pass or stop a particular band in an all frequency range, or output signals with a phase changed across the central angular frequency as a boundary are transformed in polyphase coordinates if the output signals are polyphase output signals, and fed back to the inverter device.

7. A filter circuit for communications/control, characterized in that an input signal (whose quantity of Laplace transformation is represented by Ux) of a filter circuit of a two-input/two-output system is branched into two signals, one of the two signals is supplied to an input of the filter circuit, the remainder is passed through a circuit (j circuit) which generates a signal that is 90 degrees out of phase with Ux, and supplied as an imaginary input signal (Uy) to another input of the filter circuit, the filter circuit outputs two output signals Vx, Vy in response to the input signals Ux, Uy supplied thereto, the two input signals and the two output signals are handled as respective complex variables (U=Ux+ jUy, V=Vx+jVy) using an imaginary number unit j, a transfer function of a lowpass or highpass filter of real coefficients is represented by F(s), a central angular frequency to be passed or stopped is represented by $\omega$, a complex coefficient transfer function produced by replacing the Laplace operator "s" with "s–j$\omega$" in the transfer function F(s) is represented by F(s–j$\omega$), and when the input signal U is passed through the complex coefficient transfer function F(s–j$\omega$), an output signal is expressed by V, a transfer expression is represented by:

$$U \cdot F(s-j\omega) = V$$

characterized in that both sides of the transfer expression are multiplied by the denominator of F(s–j$\omega$), and connections are made with a transfer element of real coefficients in order to equalize real and imaginary parts of the transfer expression.

8. A filter circuit according to claim 7, characterized in that two central angular frequencies to be passed or stopped are represented by $\omega_1$, $\omega_2$, respectively, with $\omega_1 \neq \omega_2$, and in order to pass a component including a bandwidth (2$a$) across $\omega_1$ at its center and stop a component including a bandwidth (2$b$) across $\omega_2$ at its center, said complex coefficient transfer function is represented by:

$$k(s+b-j\omega_2)/(s+a-j\omega_1)$$

or $$k(s+b-j\omega_2)/\{(s-j\omega_1)^2+2za(s-j\omega_1)+a^2\}$$

where k is an arbitrary gain or coefficient and z is an arbitrary dimensionless number.

9. A filter circuit according to claim 8, characterized in that $\omega$, $\omega_1$, $\omega_2$ are not constants, but variables, and instantaneous values thereof are supplied.

10. A filter circuit according to claim 7, characterized in that the numerator and/or denominator of the transfer function F(s) includes a second-order system represented by:

$$k(s^2+2zas+a^2)$$

where k is an arbitrary real gain or coefficient and 2$a$ represents a bandwidth with the central angular frequency to be passed or stopped, and regions near corners at opposite ends of the bandwidth of gain characteristics of frequency characteristics of the filter are brought closely to an ideal filter by replacing s with (s–j$\omega$) and selecting the dimensionless number z arbitrarily.

11. A filter circuit for communications/control, comprising a plurality of filter circuits for communications/control according to claim 7, for passing or stopping a particular band in an entire frequency range.

12. A filter circuit for communications/control, having a filter portion for extracting a necessary angular frequency component or a band component from an input signal with a complex coefficient transfer function of a two-input/two-output system according to claim 7, and a complex gain portion for imparting a necessary phase angle to the extracted component, and output signals having passed through the filter portion and the complex portion being used to estimate a state quantity required for control or stabilize a mode of the extracted component, wherein said complex gain portion comprises a complex gain circuit represented by A+jB≡Fc where A, B are real constants, and said complex gain portion is connected such that input signals (Ux, Uy) supplied to and output signals (Vx, Vy) from x- and y-axes of Fc are related as follows:

$$Vx=AUx-BUy$$

$$Vy=BUx+AUy$$

not only an arbitrary gain but also a phase angle can be imparted to the extracted component by selecting A, B arbitrarily, and an arbitrary necessary phase angle is imparted to only a frequency range required to estimate a signal related to communications or control.

13. A filter circuit according to claim 7, characterized in that said j circuit comprises an integrator in which, if there is a single passband or stopband, the numerator of an integrator 1/s is multiplied by a value, as a gain, which is a central angular frequency of the passband or stopband or in a range from 1/10 to 10 times thereof, or if there are plurality of passbands or stopbands, the numerator of an integrator 1/s is multiplied by a value, as a gain, which is an average of central angular frequencies of the passbands or stopbands or in a range from 1/10 to 10 times thereof, or an incomplete integrator in which a constant which is about 1/10 of said gain or less is added to the denominator s of the integrator.

* * * * *

UNITED STATES PATENT AND TRADEMARK OFFICE
CERTIFICATE OF CORRECTION

PATENT NO. : 6,212,540 B1  
DATED : April 3, 2001  
INVENTOR(S) : Murakami et al.

It is certified that error appears in the above-identified patent and that said Letters Patent is hereby corrected as shown below:

<u>Title page,</u>
Item [73], Assignee: please insert -- Ebara Corporation, Tokyo, Japan --

Signed and Sealed this

Second Day of July, 2002

Attest:

Attesting Officer

JAMES E. ROGAN
*Director of the United States Patent and Trademark Office*